United States Patent

Tomishima

[11] Patent Number: 6,078,542
[45] Date of Patent: Jun. 20, 2000

[54] SEMICONDUCTOR MEMORY DEVICE IMPLEMENTING MULTI-BANK CONFIGURATION WITH REDUCED NUMBER OF SIGNAL LINES

[75] Inventor: Shigeki Tomishima, Hyogo, Japan

[73] Assignee: Mitsubishi Denki Kabushiki Kaisha, Tokyo, Japan

[21] Appl. No.: 09/204,282

[22] Filed: Dec. 3, 1998

[30] Foreign Application Priority Data

Jun. 19, 1998 [JP] Japan .................................. 10-173452

[51] Int. Cl.⁷ ...................................................... G11C 8/00
[52] U.S. Cl. .............................. 365/230.03; 365/230.06; 365/196
[58] Field of Search ......................... 365/230.03, 230.06, 365/231, 189.04, 203, 196

[56] References Cited

U.S. PATENT DOCUMENTS 5,831,924 11/1998 Nitta et al. ...................... 365/230.03
5,867,440 2/1999 Hidaka ................................ 365/226

FOREIGN PATENT DOCUMENTS 9-64308 3/1997 Japan .
9-73776 3/1997 Japan .

OTHER PUBLICATIONS

"A 32–Bank Gb Self–Strobing Synchronous DRAM with 1GByte/s Bandwidth", J. Yoo et al., IEEE Journal of Solid–State Circuits, vol. 31, No. 11, Nov. 1996, pp. 1635–1643.

"A 1.6–GB/s Data–Rate 1–Gb Synchronous DRAM with Hierarchical Square–Shaped Memory Block and Distributed Bank Architecture", N. Sakashita et al., IEEE Journal of Solid–State Circuits, vol. 31, No. 11, Nov. 1996, pp. 1645–1655.

*Primary Examiner*—David Nelms
*Assistant Examiner*—Thong Le
*Attorney, Agent, or Firm*—McDermott, Will & Emery

[57] ABSTRACT

A memory cell array in a semiconductor memory device according to the present invention is divided into a plurality of banks along the row-direction. Each bank is further divided into a plurality of sub blocks along the column-direction. Sub blocks belonging to the same group, in other words, sub blocks arranged adjacent to each other along the row-direction share the same row address. An accessing operation to an addressed memory cell is performed on the basis of a sub block. The activation of a sub block is performed by a control circuit provided for each of the sub blocks based on a signal activated for each of the banks and the same group based on an address signal.

20 Claims, 19 Drawing Sheets

- ROW ADDRESS SIGNAL
- BANK SIGNAL
- Ext.CLK,/RAS,/CAS,CS,/WE

SEMICONDUCTOR MEMORY DEVICE IMPLEMENTING MULTI-BANK CONFIGURATION WITH REDUCED NUMBER OF SIGNAL LINES

BACKGROUND OF THE INVENTION

1. Field of the Invention

The present invention relates generally to semiconductor memory devices, and more particularly, to the configuration of a memory array portion in a semiconductor memory device of a multi-bank configuration having a plurality of banks.

2. Description of the Background Art

As higher function microprocessors have been developed recently, there are increasing needs for specifications which permit mass storage a capacity and high speed accessing in the field of semiconductor memory devices. In order to meet these needs for achieving higher function for the devices, DRAMs of a so-called multi-bank configuration having a plurality of banks and capable of operating these banks in a multiplied manner have been implemented.

Conventional Device 1

A DRAM of a multi-bank configuration is for example disclosed by Yoo et al, "A 32-Bank 1 Gb Self-Strobing Synchronous DRAM with 1 Gbyte/s Bandwidth", IEEE Journal of Solid-State Circuits, Vol. 31, No. 11, November 1996, pp. 1635 to 1642 (hereinafter referred to as "Conventional Art 1").

FIG. 19 is a schematic diagram of the configuration of a memory cell array portion in a DRAM 2000 of a multi-bank configuration according to Conventional Art 1.

Referring to FIG. 19, the memory cell array portion includes a memory cell array 500, a row decoder 520 and a column decoder 530. Memory cell array 500 is divided into 8 banks in the direction orthogonal to the column-direction, and each bank includes sub arrays 510. Each of the sub arrays includes memory cells for holding data.

Multi-bank DRAM 2000 activates a bank including a memory cell selected in response to an address signal, and reads/writes data from/to the selected memory cell by row decoder 520 and column decoder 530.

FIG. 20 is a diagram showing in detail the configuration of sub array 510. In FIG. 20, the shadowed portion in FIG. 19 is illustrated in detail.

Referring to FIG. 20, sub array 510 includes sense amplifiers 540 on both regions adjacent to a subblock in the column direction. A memory cell identified by an address signal in sub array 510 is selected by a word line activated by row decoder 520 and a column line activated by column decoder 530.

Herein, all the memory cells having the same row address are included in the same bank, one word line is provided for each row address. For the column addresses, the memory cells having the same column address are present in different banks.

As a result, in selecting a column line, a global column selecting line (GCSL) 560 and a local column selecting line (LCSL) 570 are both necessary for each of the column addresses. A local column decoder (LCD) 550 is provided corresponding to each sub array to drive local column selecting line (LCSL) 570 into a selected state.

Data in a memory cell connected to a word line driven into a selected state is amplified by sense amplifier 540, and then read out onto a local I/O line 580 according to the activation of local column selecting line 570. Local I/O line 580 is connected to a global I/O line 590 through an I/O selecting circuit 600. I/O selecting circuit 600 transmits the data on local I/O line 580 at the activated bank to global I/O line 590.

Through the above-described operations, the plurality of banks included in memory cell array 500 may each perform a data processing independently from one another, such that high processing capability is achieved. However, since the column selecting lines should be provided in a hierarchical arrangement as described above, several problems as follows are encountered.

FIG. 21 is a diagram for illustrating the configuration of local column decoder (LCD) 550. Referring to FIG. 21, global column selecting line GCSL is a common signal line for all the banks, and activated in a column including an addressed memory cell. Meanwhile, local column selecting line LCSL is effective only in each respective bank.

Local column selecting line LCSL is connected to global column selecting line GCSL by a transistor 610 receiving at its gate a BANK signal line 630 which transmits a signal (BANK signal) indicating the selected state of a bank. Local column selecting line LCSL is also connected to a ground potential by a transistor 620 receiving at its gate a /BANK signal line 640 which transmits the inverse of the BANK signal.

Local column decoder (LCD) 550 drives local column selecting line LCSL into a selected state (at an "H" level) if global column selecting line GCSL and BANK signal line 630 are both activated (into an "H" level).

The potential of local column selecting line 570 in the selected state, however, corresponds to a value produced by subtracting the threshold value of transistor 610 connected between the local and global column selecting lines from the potential corresponding to the activated state of global selecting line 560. A bit line onto which data in the addressed memory cell is read out is connected to local I/O line 580 through a transistor (not shown) receiving at its gate the local column selecting line, and therefore the resulting final potential on local I/O line 580 is lower than the initial potential. As a result, the potential corresponding to the "H" level of the data could be lower than enough. In order to solve this drawback, if the potential of the BANK signal line in the activated state (at an "H" level) is raised by the amount of the threshold voltage of N-type transistor 610, the power consumption could further increase.

All the memory cells having the same row address in memory cell 500 belong to the same bank, and are connected to a single main word line. As a result, for a single row selecting operation, the sense amplifiers corresponding to all the memory cells included in the same one row should be activated, which impedes a reduction in the power consumption.

Conventional Art 2

In order to eliminate the above-described disadvantages, Japanese Patent Laying-Open No. 9-73776 discloses the configuration of a multi-bank DRAM in which each bank is divided in the direction orthogonal to the row-direction (hereinafter referred to as "Conventional Art 2").

FIG. 22 is a schematic diagram of the configuration of a memory cell array portion in a DRAM 3000 of a multi-bank configuration according to Conventional Art 2.

Referring to FIG. 22, the memory cell array portion includes a memory cell array 500, a row decoder 520, a word line driver 525, and a column decoder 530. Memory cell array 500 is divided into 8 banks in the direction orthogonal to the column-direction, and each bank includes sub arrays 510.

Memory cell array 500 includes 4 banks separated in the column-direction. Each bank is further divided into sub arrays 510. Sub array 510 includes a plurality of memory cells for storing data.

In multi-bank DRAM 3000, memory cells having the same column address are included in the same bank, and the banks include sub column decoders 531 to 534. A column selecting line 700 needs only be provided on a column-basis. Therefore, unlike multi-bank DRAM 2000 described above, the lowering of the potential level during transmitting stored data onto the I/O line caused by the hierarchical arrangement of the column selecting lines is not encountered.

FIG. 23 is a diagram showing the arrangement of word selecting lines in multi-bank DRAM 3000.

Referring to FIG. 23, multi-bank DRAM 3000 includes a main word line 710 provided corresponding to each row as a common signal line to all the banks in order to select a memory cell at a designated row address, a sub word line 720 for selecting a corresponding row in the same bank, and a logic gate 730 which associates main word line 710 and sub-word line 720.

Main word line 710 is connected with the sub word line 720 of each bank through logic gate 730. Logic gate 730 is provided for each row in each bank, and receives main word line 710 and bank selecting signals B1 to B4. Logic gate 730 takes the logical product of the main word line and the bank selecting signal, to bring, into a selected state, a sub word line corresponding to main word line 710 in an activated state in a selected bank and initiates the operation of reading out data.

FIG. 24 is a schematic diagram of the configuration of the periphery of sense amplifiers in multi-bank DRAM 3000. Referring to FIG. 24, sense amplifier 800 is connected with a bit line pair BL, /BL through transistor gates 770 and 780, and is activated by sense amplifier activation signals SPN1 to SPN4.

Transistor gates 770 and 780 receive at their gates signals BIU1 to BIU4 and BIL1 to BIL4, and connect or disconnect between bit line pair BL, /BL and sense amplifier 800 based on the state of these signals.

In a selected bank, data in a memory cell read out on bit line pair BL, /BL by sub word line 720 is amplified by sense amplifier 800. The amplified data is transmitted to a global I/O line (not shown) based on the state of bank selecting signals B1 to B4 through a local I/O line.

In multi-bank DRAM 3000, since the bank configuration divided in the column-direction is employed, only the memory cells belonging to the same bank among the memory cells having the same row address need only be selected in a single row selecting operation. As a result, the number of memory cells and sense amplifiers activated in a single row selecting operation are smaller than the case of multi-bank DRAM 2000 according to Conventional Art 1.

As a result, multi-bank DRAM 3000 achieves high data processing capability by driving a plurality of banks independently from one another while reducing the power consumption.

Multi-bank DRAM 3000 however should transmit, to the corresponding banks, all the signals to control a row selecting operation such as sense amplifier activation signals SPM1 to SPM4, and BL selecting signals BIU1 to BIU4 and BIL1 to BIL4 in a corresponding manner.

As a result, despite the above-described advantages, the number of signal lines provided in the row-direction is considerably large. Such increase in the number of signal lines could reduce the distances between the signal lines, which increases line capacitance. Accordingly, faults such as signal delay or short circuit could be frequently caused.

In multi-bank DRAM 3000, sub word lines are driven into a selected state by directly associating the activated states of bank selecting signals B1 to B4 and main word line 710, and therefore a fault may be caused if memory cells belonging to different banks are selected at the same timing.

Referring back to FIG. 23, the disadvantage will be detailed.

Let us now assume that a memory cell MCa in the first row in bank #1 is selected, and then a memory cell MCb in the second row in bank #4 is selected. For selecting MCa, bank selecting signal B1 and main word line MW1 should be activated. Herein, until data in memory cell MCa is finally transmitted onto the global I/O line, the activated state of bank selecting signal B1 should be maintained.

Meanwhile, if the next operation of selecting memory cell MCb is to be initiated, bank selecting signal B4 and main word line MWL2 should be activated. At this time, since bank selecting signal B1 is maintained in the activated state, sub word line SWL21 is driven into a selected state corresponding to the activation of main word line MWL2.

Memory cell MCc is thus activated as well, in other words, a plurality of memory cells row-selected could be connected to the same bit line. This could cause destruction of data depending upon the timing, which poses a serious problem to the stability of the operation of the DRAM.

SUMMARY OF THE INVENTION

It is an object of the present invention to provide a semiconductor memory device of a multi-bank configuration that permits a reduction both in the number of signal lines and in the power consumption.

Stated shortly, a semiconductor memory device according to the present invention includes a memory cell array including a plurality of memory cells arranged in a matrix of rows and columns, and a row selecting circuit and a column selecting circuit for selecting a memory cell corresponding to an address signal.

The memory cell array is divided into a plurality of sub blocks provided in a matrix of a first plurality of columns and a second plurality of rows, and includes the first plurality of banks that permits reading/writing operations independently from each other.

Each of the banks has the second plurality of sub blocks provided adjacent to each other along the column-direction.

The row selecting circuit includes a memory cell selecting circuit provided for each of the sub blocks to activate a corresponding sub block.

A main advantage of the present invention therefore lies in that in a semiconductor memory device of a multi-bank configuration having a plurality of banks formed by dividing the array in the column-direction, a word line selecting operation may be performed independently for each sub block, and both the number of signal lines and the power consumption may be reduced at a time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
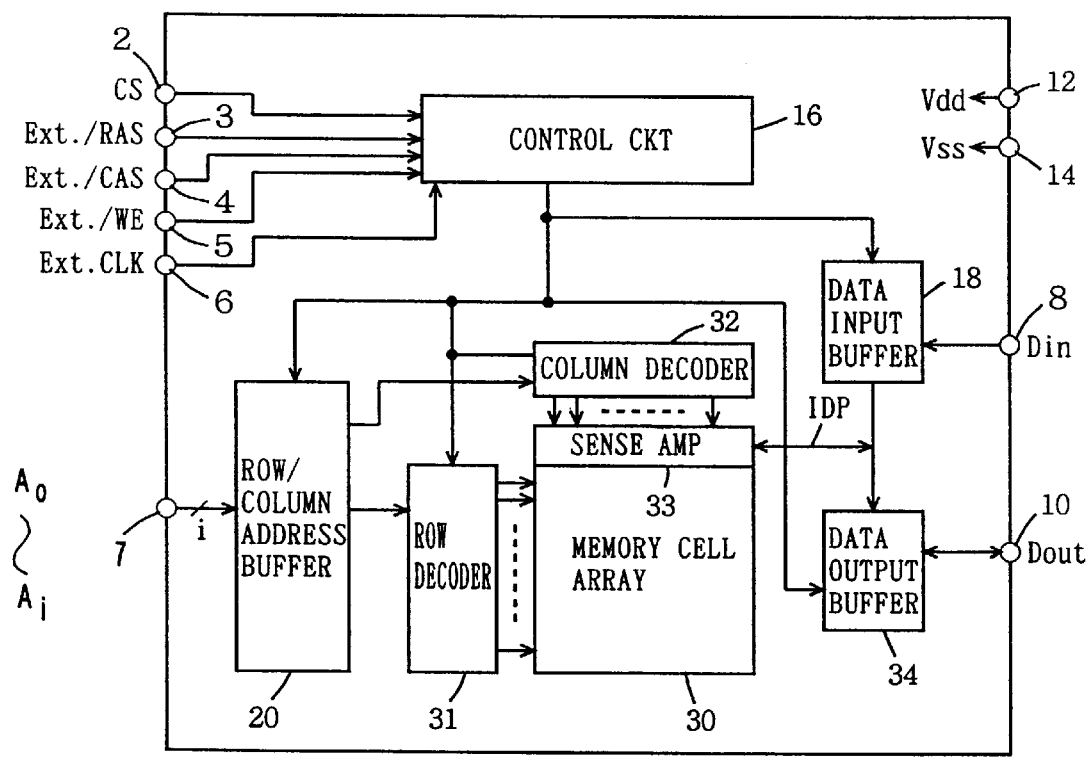
FIG. 1 is a schematic block diagram of the configuration of a semiconductor memory device 1 according to a first embodiment of the invention.

FIG. 1 is a schematic block diagram of the configuration of a semiconductor memory device 1 according to a first embodiment of the invention.

Referring to FIG. 1, semiconductor memory device 1 includes control signal input terminals 2 to 6, an address input terminal 7, an input terminal Din for inputting data, an output terminal Dout for outputting a data signal, a ground terminal 12, and a power supply terminal 14.

Semiconductor memory device 1 further includes a control circuit 16, a row/column address buffer 20, a memory cell array 30, a row decoder 31, a column decoder 32, a sense amplifier-input/output control circuit 33, a data input buffer 18 and a data output buffer 34.

Control circuit 16 generates a control clock signal corresponding to a prescribed operation mode based on a row address strobe signal Ext./RAS, a column address strobe signal Ext./CAS, a chip select signal CS, a write enable signal Ext./WE, and an external clock signal Ext.CLK, the signals externally applied through control signal terminals 2 to 6. Control circuit 16 thus controls the operation of the entire semiconductor memory device. As can be clearly understood from the following description, however, the configuration according to the present invention is not limited to that of a so-called synchronous type semiconductor memory device.

Row/column address buffer 20 applies an address signal generated based on each of externally applied address signals A0 to Ai (i: natural number) to row decoder 31 and column decoder 32.

A memory cell in memory cell array 30 addressed by row decoder 31 and column decoder 32 exchanges data with the outside thereof through sense amplifier-input/output control circuit 33 and data input buffer 18 or data output buffer 34 by input terminal Din or output terminal Dout.

Figure 2:
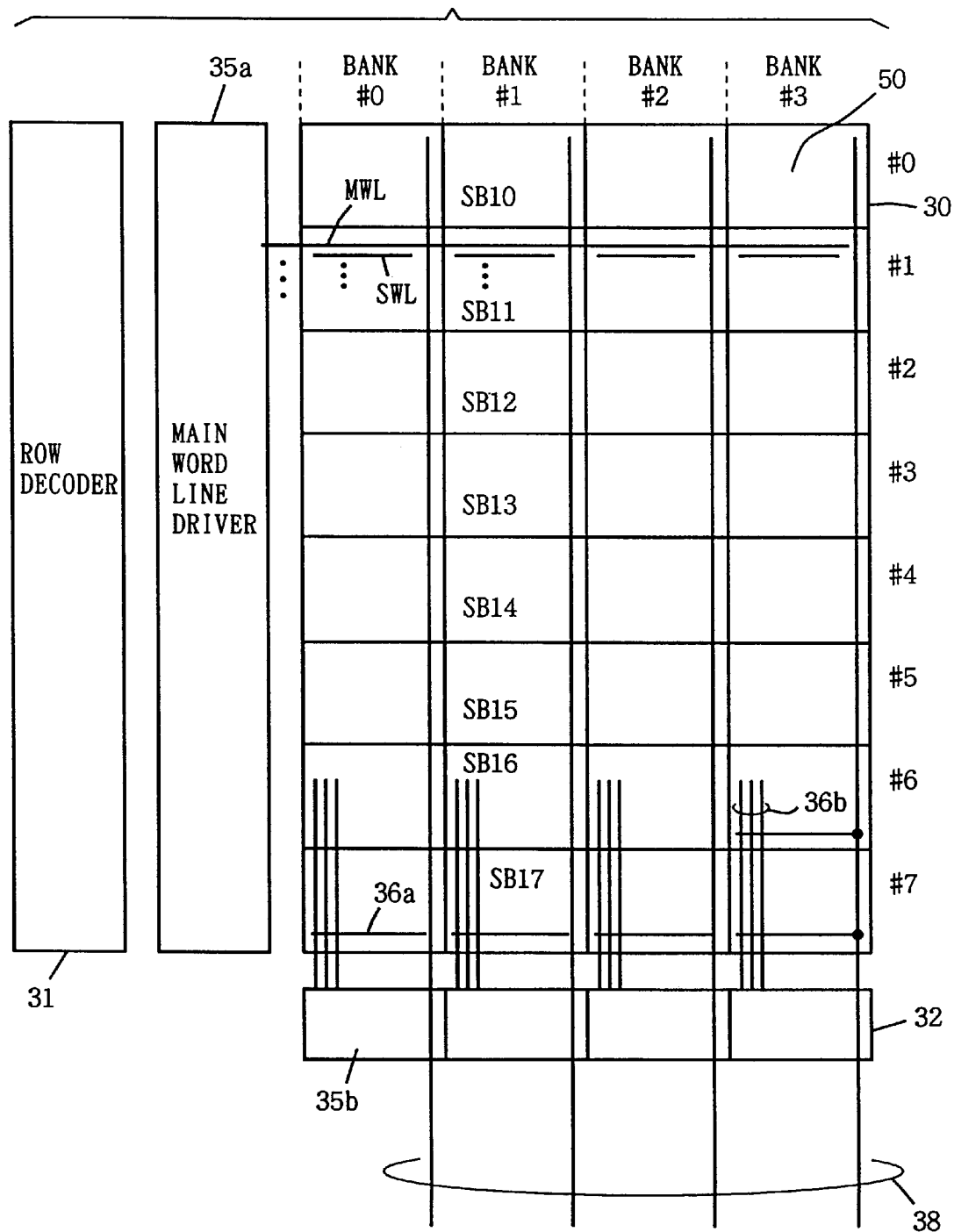
FIG. 2 is a diagram for use in illustration of the concept of the configuration of the periphery of one memory cell array 30 in semiconductor memory device 1.

FIG. 2 is a schematic diagram of the configuration of memory cell array 30 in semiconductor memory device 1 and its periphery. In FIG. 2, memory cell array 30 is for example divided into four divisions (#0 to #3) in the column-direction, and then further divided into eight divisions (#0 to #7) in the row-direction. More specifically, memory cell array 30 is divided into a 4×8 matrix of sub blocks.

If, for example, a sub block at #1 in the row-direction and at #2 in the column-direction is denoted as SB 12, eight sub blocks, SB10 to SB17 form this single bank #1.

As a result, memory cell array 30 in FIG. 2 is divided into four banks #0 to #3. Memory cells having the same row address are included in sub blocks adjacent to each other in the row-direction and belonging to different banks (hereinafter referred to as sub blocks in the same group).

In each of banks #0 to #3, a global I/O line 38 is provided extending in the column-direction over all the sub blocks. A column decoder 32 is divided into sub column decoders 35b corresponding to banks #0 to #3.

A column selecting line (CSL) 36b is provided to extend in the column-direction from each of sub column decoders 35b over all the sub blocks within the same bank along the column-direction.

Figure 22:
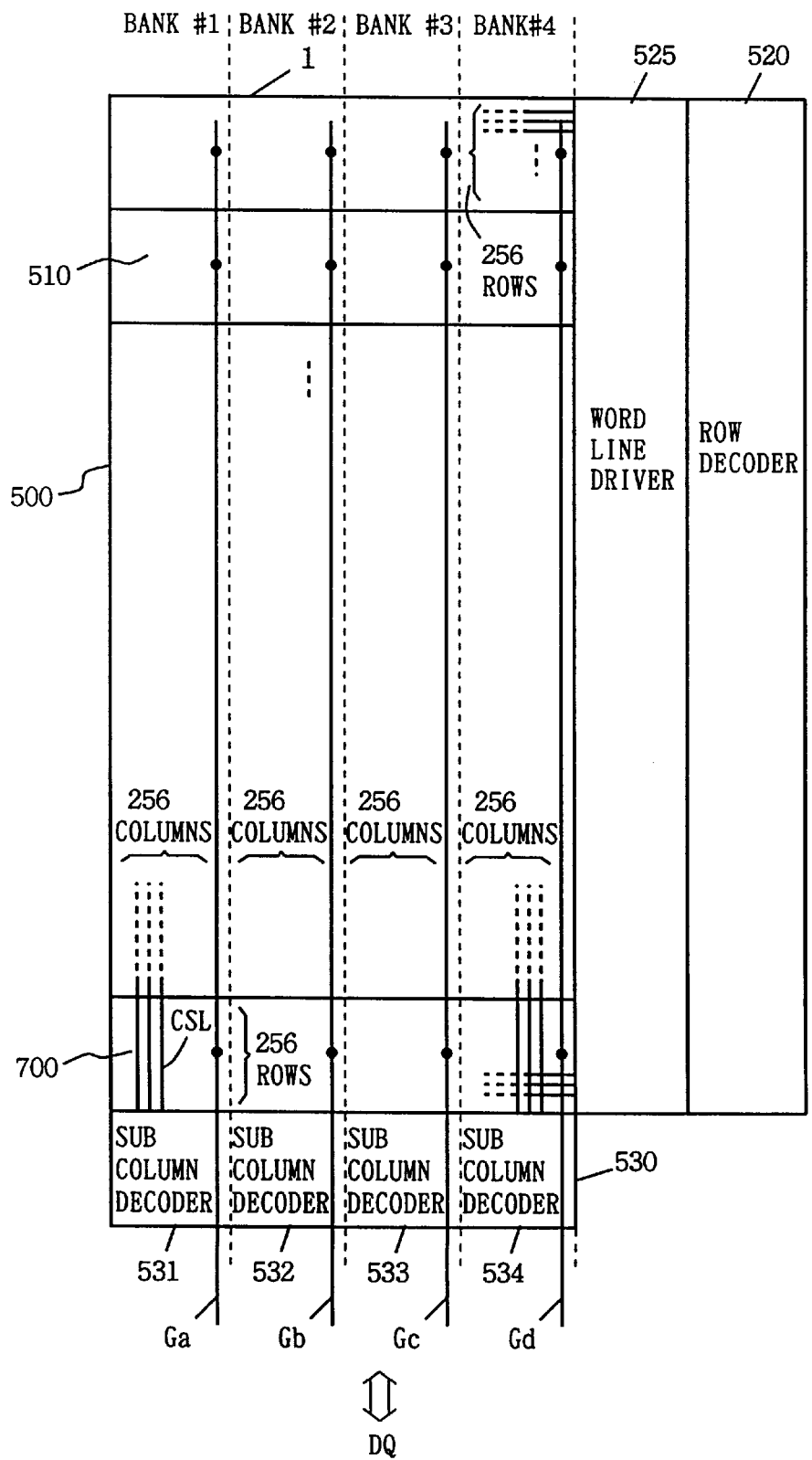
FIG. 22 is a diagram of the configuration of a memory cell array in a multi-bank DRAM 3000 according to Conventional Art 2.
Figure 23:
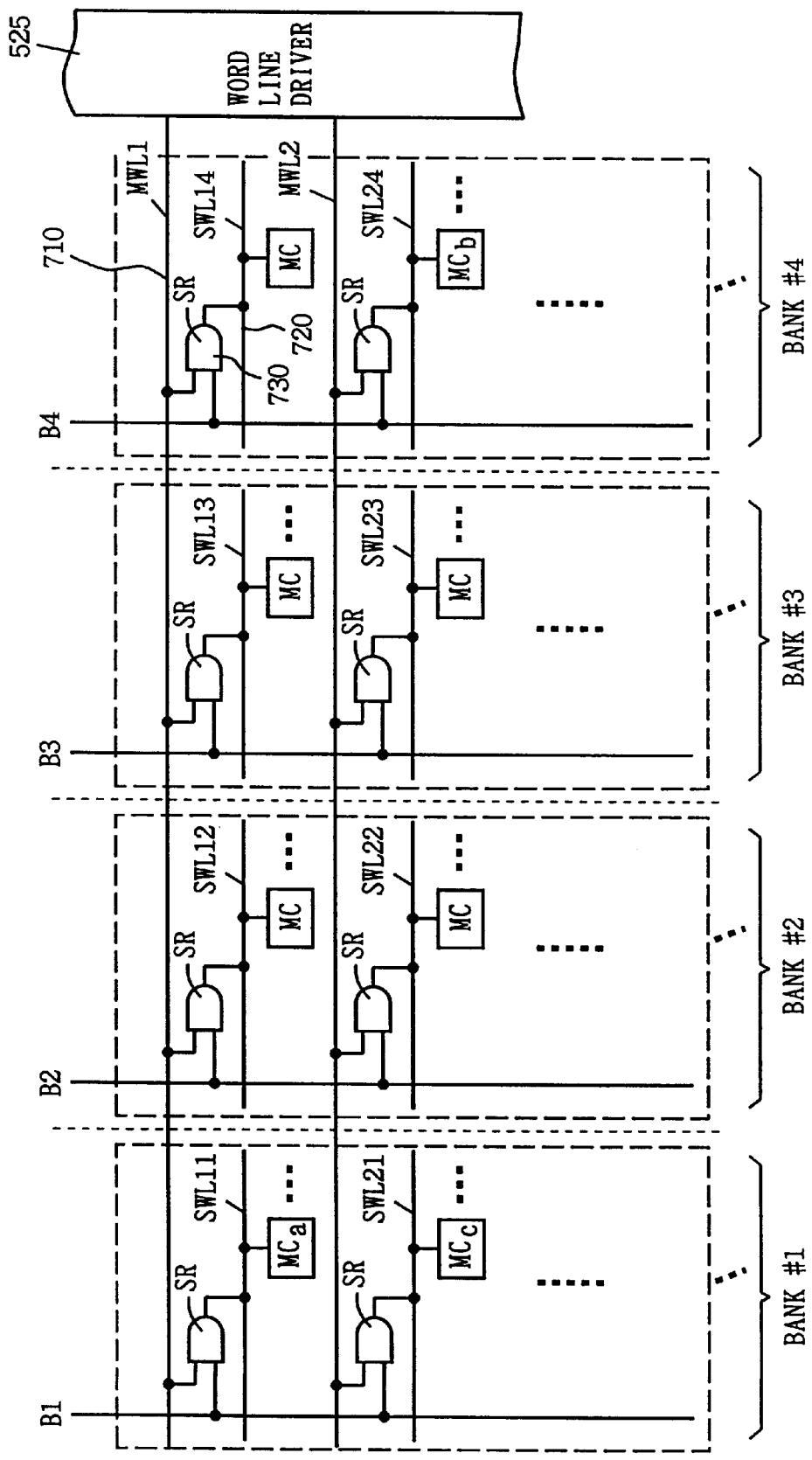
FIG. 23 is a diagram for use in illustration of a row selecting operation in multi-bank DRAM 3000 according to Conventional Art 2.
Figure 24:
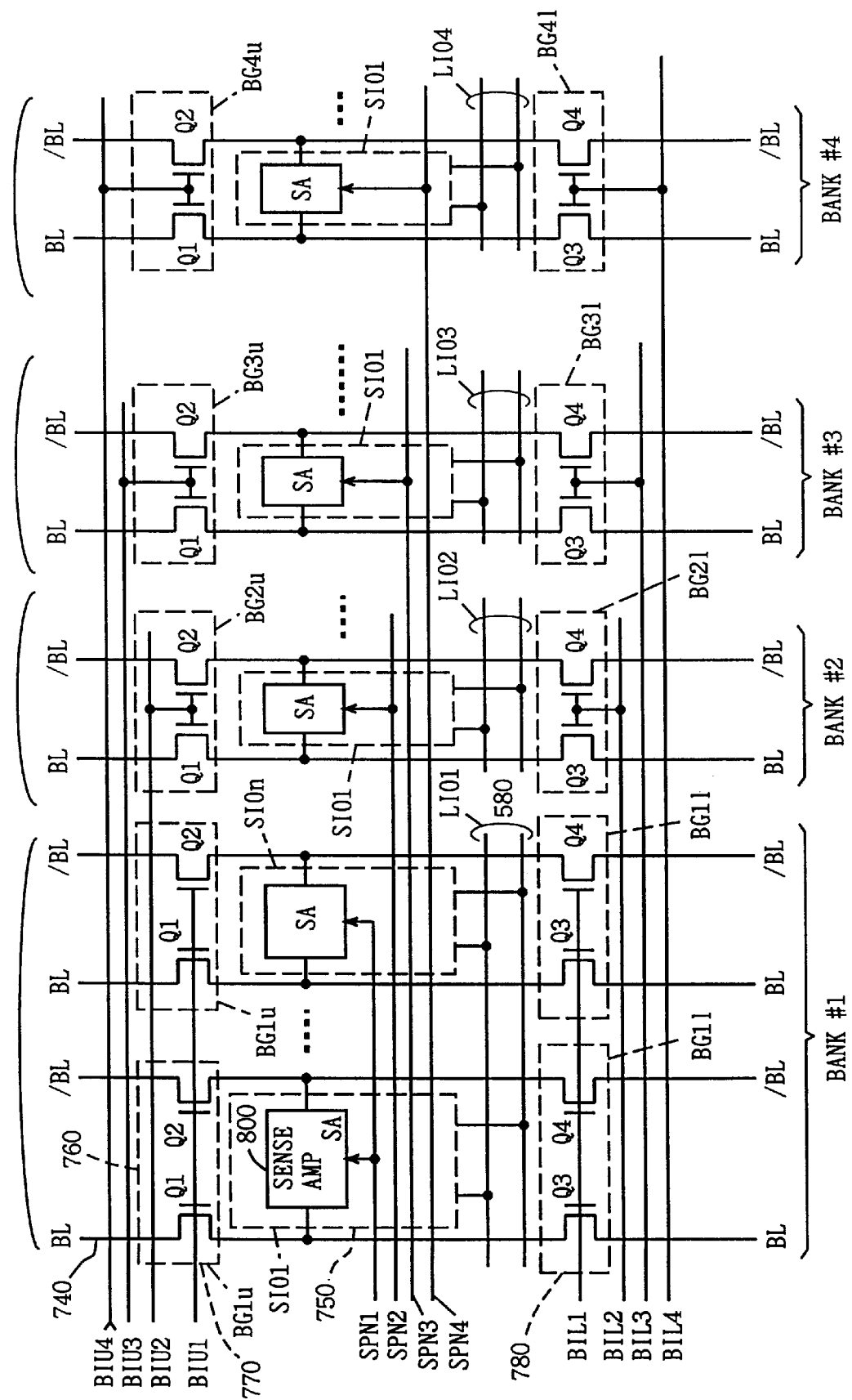
FIG. 24 is a diagram for use in illustration of the configuration of a sense amplifier band in multi-bank DRAM 3000 according to Conventional Art 2 and problems associated with the configuration.

The arrangement of the column selecting lines (CSL) is the same as that in multi-bank DRAM 3000 according to Conventional Art 2 shown in FIG. 22.

In memory cell array 30, a row decoder 31 and a main word line driver 35a are provided to bring a corresponding row based on a row address signal into a selected state.

Row decoder 31 decodes an applied row address signal and outputs a main row selecting signal to designate the selected row address. Main word driver 35a brings a corresponding main word line MWL into a selected state according to the row selecting signal (word line selecting signal) from row decoder 31. The configuration from main word line driver 35a to sub word line SWL in each of the sub blocks will be later detailed. In the activated sub block, the addressed sub word line SWL is brought into a selected state.

Sub column decoder 35b is activated when a corresponding bank is addressed, decodes an applied column address signal, and drives a corresponding column selecting line into a selected state.

Each of the sub blocks is provided with a local I/O line 36a. A memory cell corresponding to an address signal is selected by the word line selecting line and column selecting line, and the data of the memory cell is read out onto local I/O line 36a.

Each of global I/O lines 38 is provided such that it can exchange data with all the sub blocks included in a corresponding bank. Thus, data in a memory cell corresponding to an address signal is transmitted to global I/O line 38.

Figure 3:
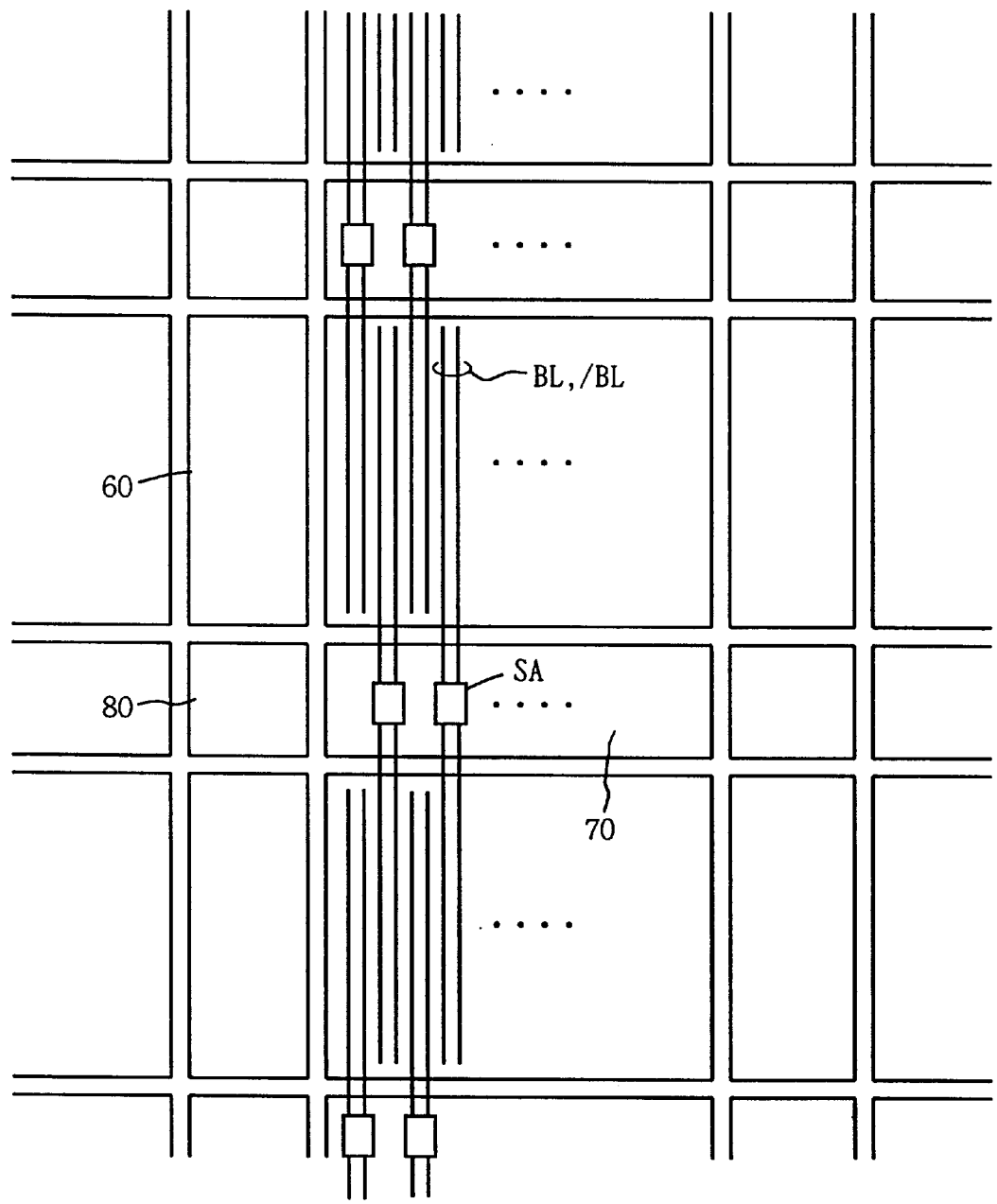
FIG. 3 is a diagram for use in illustration of the concept of the configuration of the periphery of a sub block.

FIG. 3 is a diagram for use in illustration of the concept of the configuration of the periphery of a sub block.

Referring to FIG. 3, in a region adjacent to a sub block in the row-direction, a sub word line driver 60 is provided corresponding to each of the sub blocks. Sub word line driver 60 drives a sub word line SWL provided independently between sub blocks and for each row address into a selected state.

In a region adjacent to a sub block in the column-direction, a sense I/O circuit band 70 is provided. Sense I/O circuit band 70 includes a plurality of sense amplifiers SA connected with bit lines associated with memory cells in a sub block sense amplifiers SA are each connected with a memory cell included in one of adjacent two sub blocks through bit lines. Therefore, in order to activate a sub block, two sense I/O circuit bands 70 adjacent to the sub block of interest should be activated.

Sense I/O circuit band 70 is provided in a so-called "shared-sense configuration", and permits the length of a bit line connected to the sense amplifier to be reduced in the sense amplification operation. Thus, the load capacitance of the sensing node of the sense amplifier may be reduced, which increases the reading voltage (the voltage read out onto a bit line from a memory cell), such that stable high-speed operations are enabled. The "shared-sense configuration" advantageously allows increased intervals between sense amplifiers to relive a restriction of layout.

In the region surrounded by sub word line drivers 60 and sense I/O circuit bands 70, a sub block driving circuit 80 is provided. Sub block driving circuit 80 generates various control signals in the sub block. The detailed configuration of the circuit will be later described.

Figure 4:
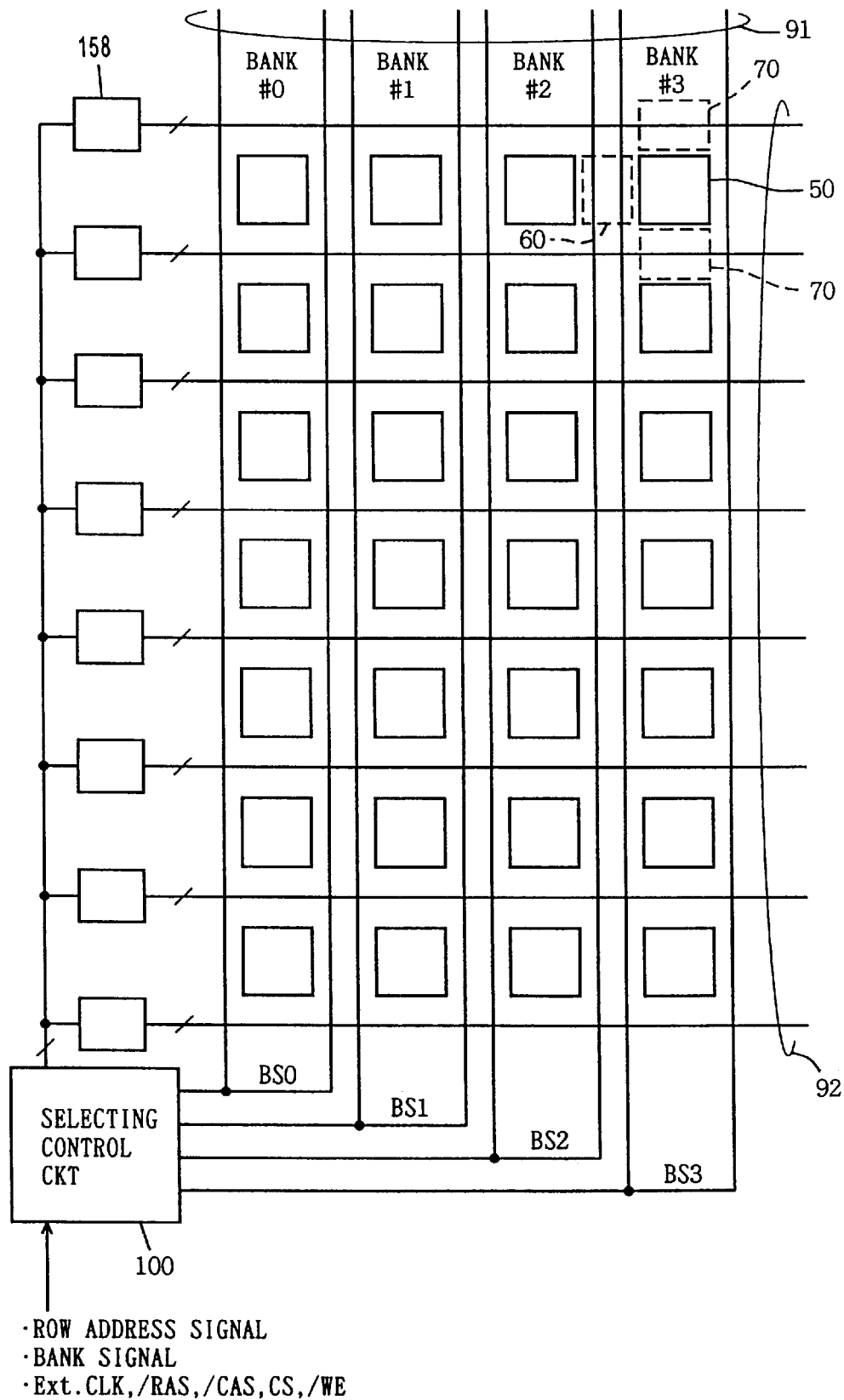
FIG. 4 is a diagram showing the arrangement of signal lines to supply a signal commonly applied to the sub blocks.

FIG. 4 is a diagram for use in illustration of the arrangement of main signal lines applied commonly to the sub blocks.

Referring to FIG. 4, selecting control circuit 100 receives an address signal and a bank signal to generate a bank selecting signal and a row-related main signal. The main signal line includes a bank selecting signal lines 91 and a main row-related common signal lines 92.

The bank selecting signal is set for each of banks (#0 to #3), and is activated (into an "H" level) in a bank including a memory cell corresponding to a designated address. Bank selecting signal line 91 applies as a common signal each of bank selecting signals BS0 to BS3 to sub blocks belonging to the same bank.

The row-related main signal is used to perform operations necessary in association with a row selection of a selected memory cell, and generated for each of the sub blocks belonging to the same group. The row-related main signal includes a sub decode signal SD, sense amplifier activation signal SP and SN, a bit line equalize signal EQS and a shared sense amplifier signal SHR.

Sub decode signal SD associates a main word line MWL and a sub word line SWL provided in a sub block. In this embodiment, since banks share the same row address, a hierarchical row selecting operation is necessary in order to independently drive the memory cell array on a bank-basis.

As a result, a main word line is provided to extend in the row-direction for each n address rows and commonly to the sub blocks belonging to the same group.

Sub decode signal SD is an n-bit signal for associating a main word line and a sub word line, and a corresponding sub decode signal is activated (into an "H" level) in response to a transition of a corresponding main word line into a selected state (at an "H" level) based on a row selecting signal (word line selecting signal).

Bit line equalize signal EQS to stop a precharge/equalizing operation controls the operation of holding a bit line connected to a memory cell at a prescribed potential (the pre-charge/equalizing operation) until a row selection is started, so that data stored in the memory cell can be more accurately detected, and the signal is activated (into an "L" level) prior to the row selection.

Sense amplifier activation signals SN and SP indicate the activation of a sense amplifier (SN: "H" level, SP: "L" level) which amplifies data in a memory cell read out on a bit line by a row selection.

A shared sense amplifier signal SHR is a signal activated (into an "H" level) to control the connection between a sense amplifier and a bit line.

A row address signal is pre-decoded by control circuit 100, and then transmitted, as a row address pre-decode signal, to row-related common signal generation circuit 158 provided for each of the groups.

Row-related common signal generation circuit 158 activates main row-related common signals SD, EQS, SP, SN, and SHR to a plurality of sub blocks belonging to the same group including a selected row address. A main row-related common signal line 92 is provided to extend in the row-direction in a region adjacent to a sub block, and transmits activated main row-related common signals to sub blocks belonging to the same group including a selected row address.

Thus, bank selecting signal line 91 and main row-related common signal line 92 corresponding to a sub block including a memory cell selected by an address signal (hereinafter referred to as a selected memory cell) are activated.

Figure 5:
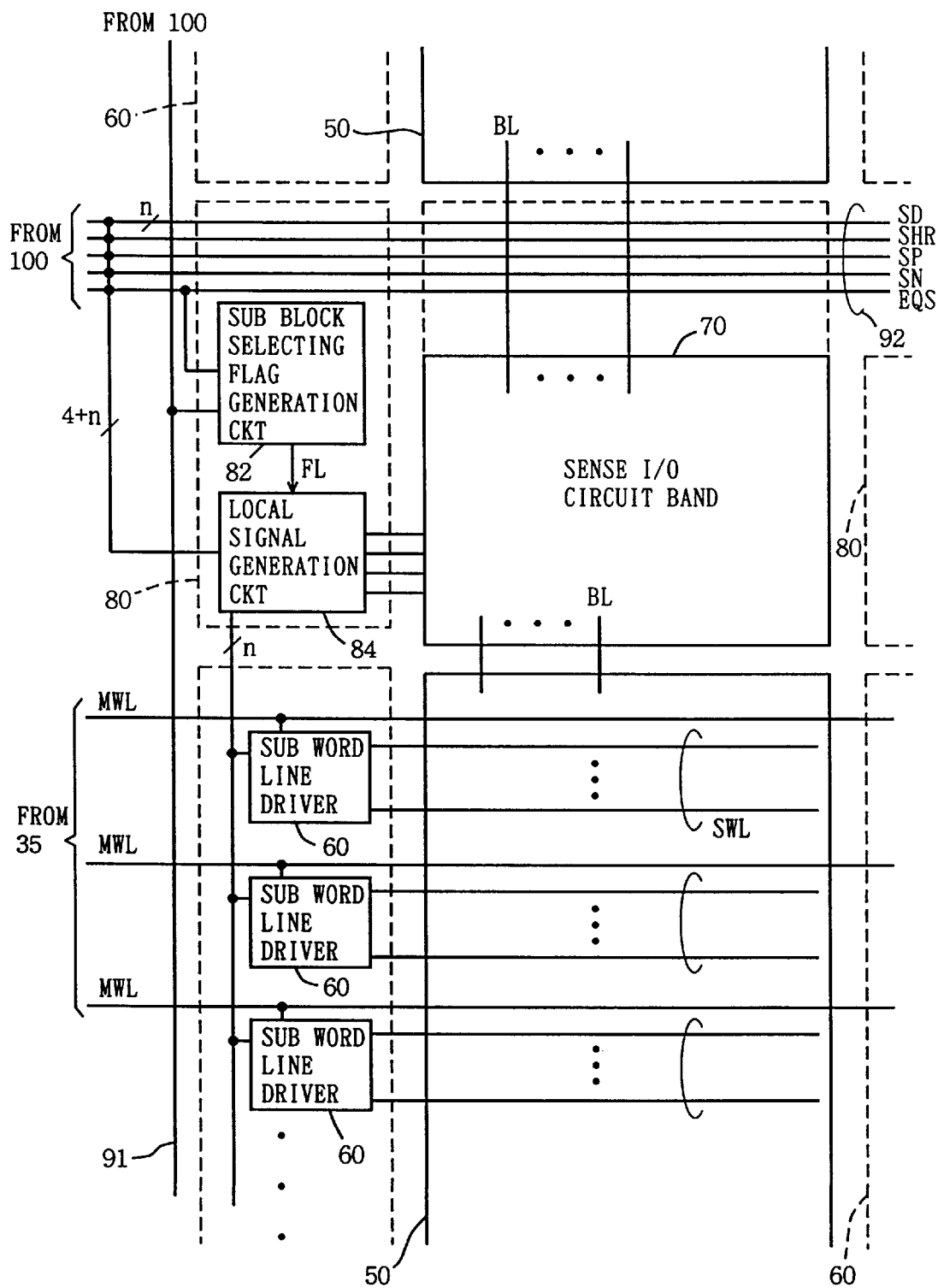
FIG. 5 is a schematic block diagram showing the configuration of a sub block driving circuit 80.

FIG. 5 is a schematic block diagram of the configuration of a sub block driving circuit 80 which permits only a sub block including a selected memory cell to be activated, and a row selecting operation to be performed to a corresponding row.

Referring to FIG. 5, sub block driving circuit 80 is provided in the region at the crossing of bank selecting signal line 91 and main row-related common signal line 92. Sub block driving circuit 80 includes a sub block selecting flag generation circuit 82 and a local signal generation circuit 84.

Sub block selecting flag generation circuit 82 receives a bank selecting signal line 91 and a signal /EQS, the inverse of a signal EQS activated earliest among main row-related signal lines 92, determines the presence of a selected memory cell in a sub block of interest if the bank selecting signal line and the signal EQS are both at an "H" level, and activates a sub block selecting flag FL (into an "H" level).

Local signal generation circuit 84 receives main row-related common signal line 92 and sub block selecting flag FL, and generates local signals Sub-SD, Sub-SHR, Sub-SH, Sub-SN and Sub-EQS, when sub selecting flag FL is activated.

Among the generated local signals, signal Sub-SD is applied to sub word line driver 60. Sub word line driver 60 receives main word line MWL and signal Sub-SD, and drives a corresponding sub word line into a selected state (into an "H" level) based on the state of the main word line and the signal sub-SD. Through the above operations, only a sub block including a selected memory cell among a plurality of sub blocks 50 included in memory cell array 30 is activated, and operations necessary for reading data are performed.

The local signals other than signal Sub-SD are supplied to sense I/O circuit bands 70, and an I/O circuit band 70 corresponding to the activated sub block is driven.

Figure 6:
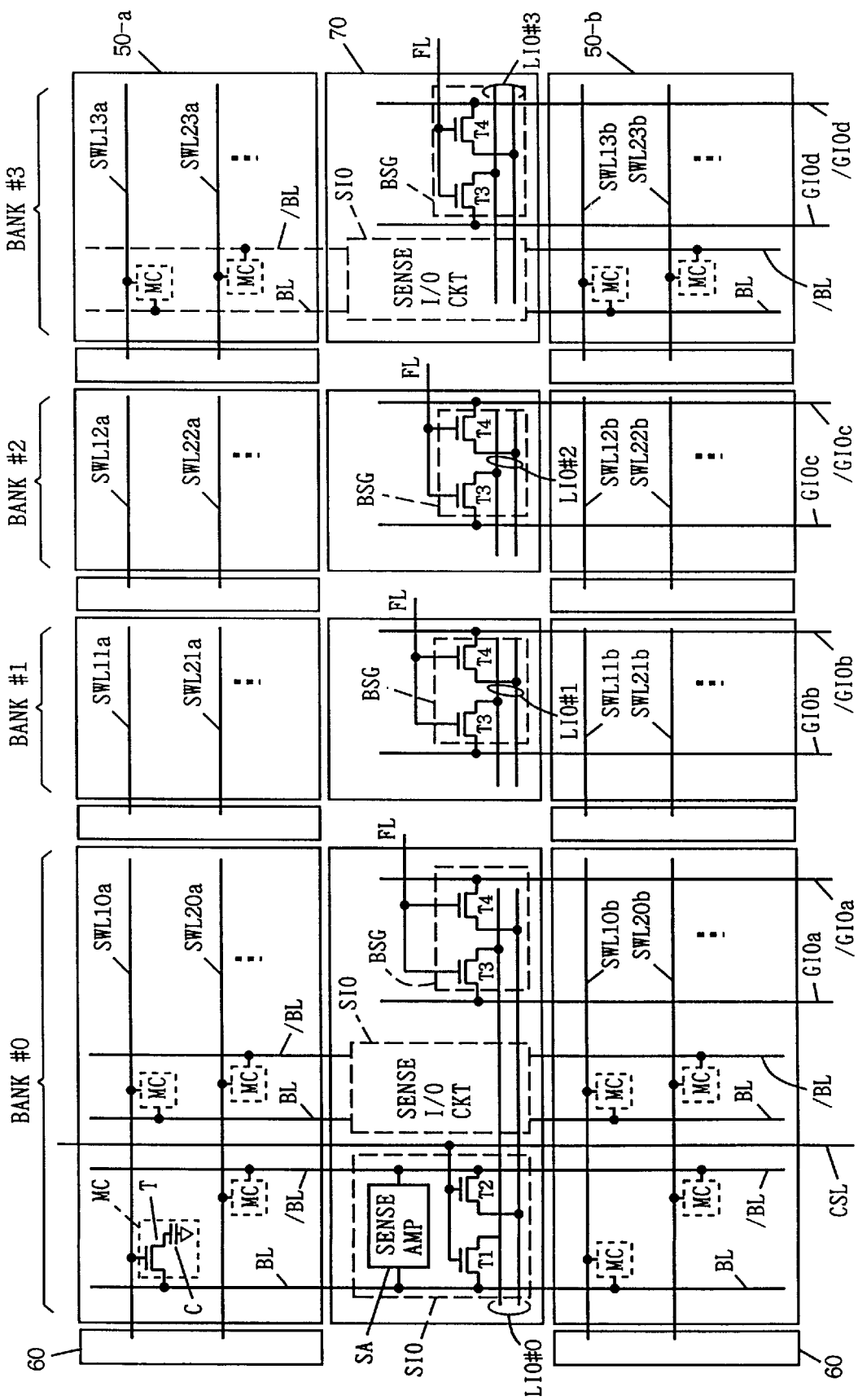
FIG. 6 is a diagram for use in illustration of the concept of the configuration of a sub block.

FIG. 6 is a diagram for use in illustration in detail of the concept of the configuration of a sub block.

FIG. 6 shows four sense I/O circuit bands 70, and eight sub blocks 50-*a* and 50-*b* in total over the four banks. Sub blocks 50-*a* and 50-*b* each include a plurality of memory cells MC provided in a matrix of rows and columns. Memory cell MC includes a capacitor C and an access transistor T. The columns in sub blocks 50-*a* and 50-*b* are arranged in alignment along the extension of the column-direction. The rows of memory cells in sub blocks 50-*a* and 50-*b* are provided in alignment along the extension of the row-direction.

A bit line pair BL and /BL is provided to extend along the column-direction corresponding to each column of memory cells included in sub blocks 50-*a* and 50-*b* connected to the same sense I/O circuit band 70. The connection between sense amplifiers SA and corresponding memory cells included in sense I/O circuit band 70 is the same as that described in conjunction with FIG. 3, and therefore the description is not repeated.

In each of sub blocks 50-*a* and 50-*b*, a sub word line SWL extending along the row-direction is provided in each of the sub blocks. A memory cell MC is provided at a crossing portion of sub word line SWL and bit line pair BL and /BL.

In each of the sub blocks, by providing a sub word line extending within a single sub block, if a memory cell is selected in the sub block, a sub word line in another sub block may be brought into a selected state to permit access to a memory cell therein, which makes the bank configuration to be readily implemented.

In sense I/O circuit band 70, a sense I/O circuit SIO is provided for bit line pair BL and /BL provided corresponding to each column of sub blocks 50-*a*, and 50-*b*. Sense I/O circuit SIO includes a sense amplifier SA for differentially amplifying the potentials on a corresponding bit line pair BL and /BL, and transmission gates T1 and T2 for connecting a corresponding bit line pair BL and /BL (the sense node of sense amplifier SA) to a corresponding local I/O line L-I/O in response to a column selecting signal applied through column selecting line CSL. In sense I/O circuit band 70, a local I/O line is provided separately for each of the sub blocks. More specifically, local I/O lines LIO#0 to LIO#3 are provided for sense I/O circuit bands belonging to banks #0 to #3, respectively.

Global I/O lines are provided for a plurality of local I/O lines belonging to the same bank. In FIG. 6, the global I/O lines are each formed by a pair of complementary signal lines. More specifically, global I/O lines GIOa, and /GIOa are provided for bank #0, global I/O lies GIOb and /GIOb for bank #1, global I/O lines GIOc and /GIOc for bank #2, and global I/O lines GIOd and /GIOd for bank #3.

In order to connect local I/O lines LIO#0 to LIO#3 and corresponding global I/O lines, block selecting gates BSG which conduct in response to a sub block selecting flag FL are provided. Block selecting gates BSG are each formed by two transmission gates T1 and T2 in order to interconnect a complementary signal line pair. Block selecting gates BSG connect local I/O lines LIO#0 to LIO#3 to global I/O lines in response to sub block selecting flag FL.

Block selecting gate BSG is provided in each of sense I/O circuit bands 70 provided corresponding to each of sub blocks 50 shown in FIG. 2. Global I/O line is provided over all the sub blocks belonging to each of the banks, and may connect an arbitrary local I/O line provided in the sub block.

The configuration of the complementary signal line pair permits two transmission gates T1 and T2 to be provided in sense I/O circuit SIO, and therefore the load of the sense node of sense amplifier SA may be equal. In each of block selecting gates BSG, two transmission gates T3 and T4 may be provided, and the loads of a local I/O line and a global I/O line may be balanced.

Note that although global I/O lines GIOa, /GIOa to GIOd, /GIOd are provided in the region where the memory cells are located for ease of illustration in FIG. 6, the layout may be more effectively designed by providing the global I/O lines in the region where the sub word drivers are provided.

Figure 7:
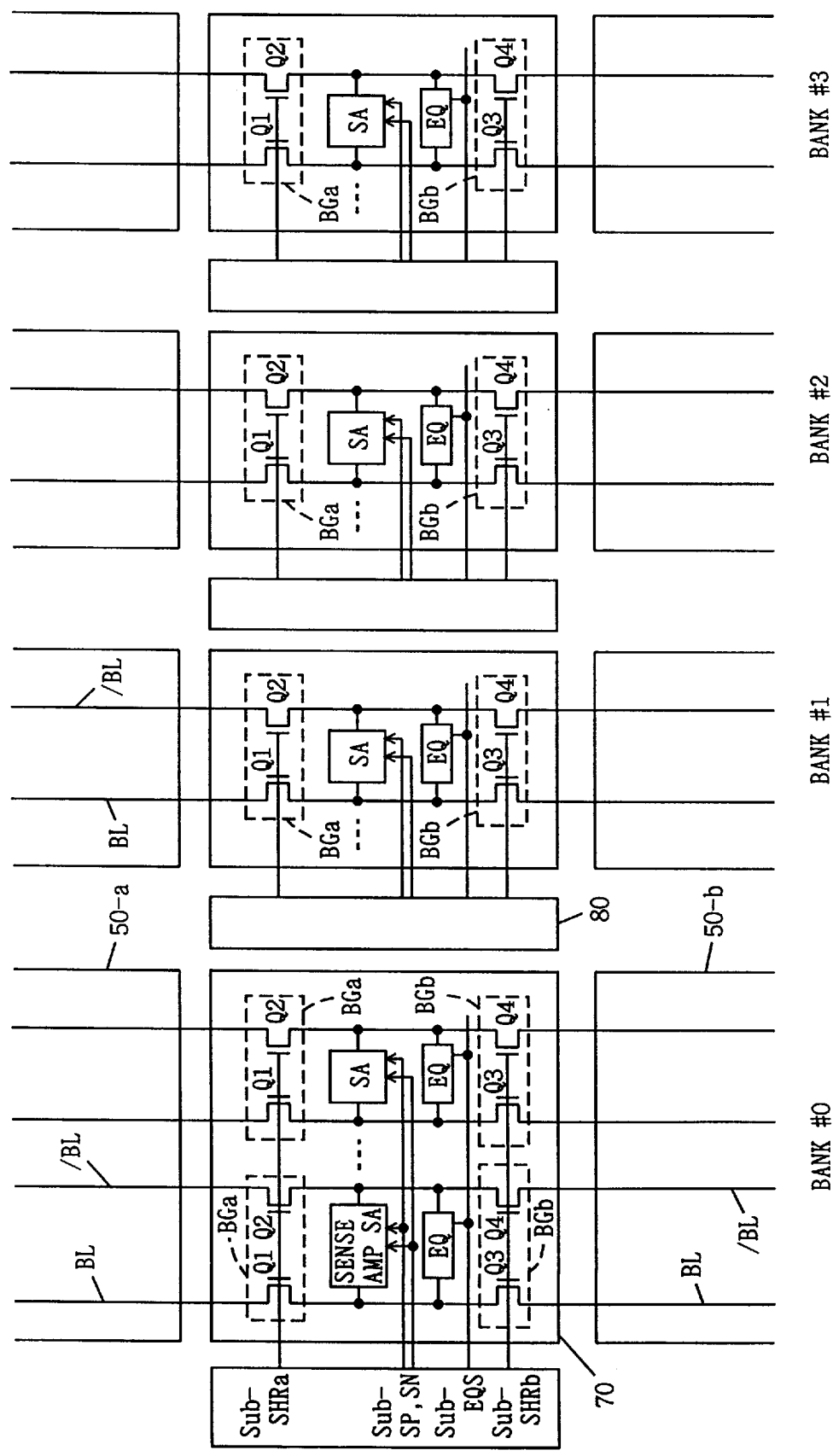
FIG. 7 is a diagram for use in illustration in detail the concept of the configuration of a sense I/O circuit band 70.

FIG. 7 is a diagram showing in detail the configuration of sense I/O circuit band 70 shown in FIG. 6. In FIG. 7, in order to avoid the complexity of illustration, transmission gates T1 and T2 for connecting local I/O line LIO and the bit line pair are not shown.

Referring to FIG. 7, in sense I/O circuit band 70, bit line isolation gates BGa and BGb, and a pre-charge/equalize circuit EQ are further shown. Bit line isolation gates BGa and BGb include transmission gates Q1 to Q4, and electrically connect or disconnect a bit line pair BL, /BL and a sense amplifier SA in a sub block including a selected memory cell in response to signals Sub-SHRa and Sub-SHRb corresponding to signal Sub-SHR, one of the sub block local signals generated by sub block driving circuit 80.

Pre-charge/equalize circuit EQ holds a bit line pair at a prescribed potential before reading out data in a memory cell MC according to a selection of a sub word line, in order to improve the accuracy of the reading operation.

Pre-charge/equalize circuit EQ also operates in response to signal Sub-EQS, one of the sub block local signals generated by sub block driving circuit 80.

Sense amplifier SA included in sense I/O circuit SIO included in sense I/O circuit band 70 is activated signals through singals Sub-SP and SN which are each one of the sub block local signals. Sense amplifier SA includes cross-coupled N channel MOS transistors and cross-coupled P-channel MOS transistors, sense amplifier activation signals Sub-SP and Sub-SN activate these cross-coupled transistors, respectively.

Sense amplifier SA, pre-charge/equalize circuit EQ and bit line isolation gates BGa and BGb are controlled by local signals generated by sub block driving circuit 80 and are activated on a sub block-basis.

A sub block including a selected memory cell is connected to a sense amplifier SA through one of corresponding bit line isolation gates BGa and BGb, and the other of bit line isolation gates BGa and BGb pairing therewith is disconnected. In a not-activated sub block, bit line isolation gates BGa and BGb continue to be in a conductive state, and sense amplifier SA is electrically connected with a corresponding bit line pair. In this state, a sub word line corresponding to a selected memory cell is brought into a selected state, and data in the memory cell is transmitted to sense amplifier SA.

Then, sense amplifier activation signals Sub-SP and SN are activated, which activates sense amplifier SA for sensing operation, and the data in the memory cell is detected and amplify.

As described above, within the range of each sub block, operations in the sub block are controlled independently from each other using local signals, such that the multi-bank operation of the entire semiconductor memory device is achieved.

These local signals are generated by sub block driving circuit 80 in each sub block based on main row-related common signals applied commonly to sub blocks belonging to the same group, and therefore the number of signal lines can be smaller than the case of multi-bank DRAM 3000 according to Conventional Art 2 which requires signal lines in the row-direction to be multiplied by the number of banks.

Since memory cells and sense amplifiers are activated for each of the sub blocks, the entire power consumption can be considerably reduced, and still the conventional advantage that the width of the power supply line and the load of the power supply circuit can be reduced is maintained.

The configuration of selecting control circuit 100 in FIG. 4 will be now described.

Figure 8:
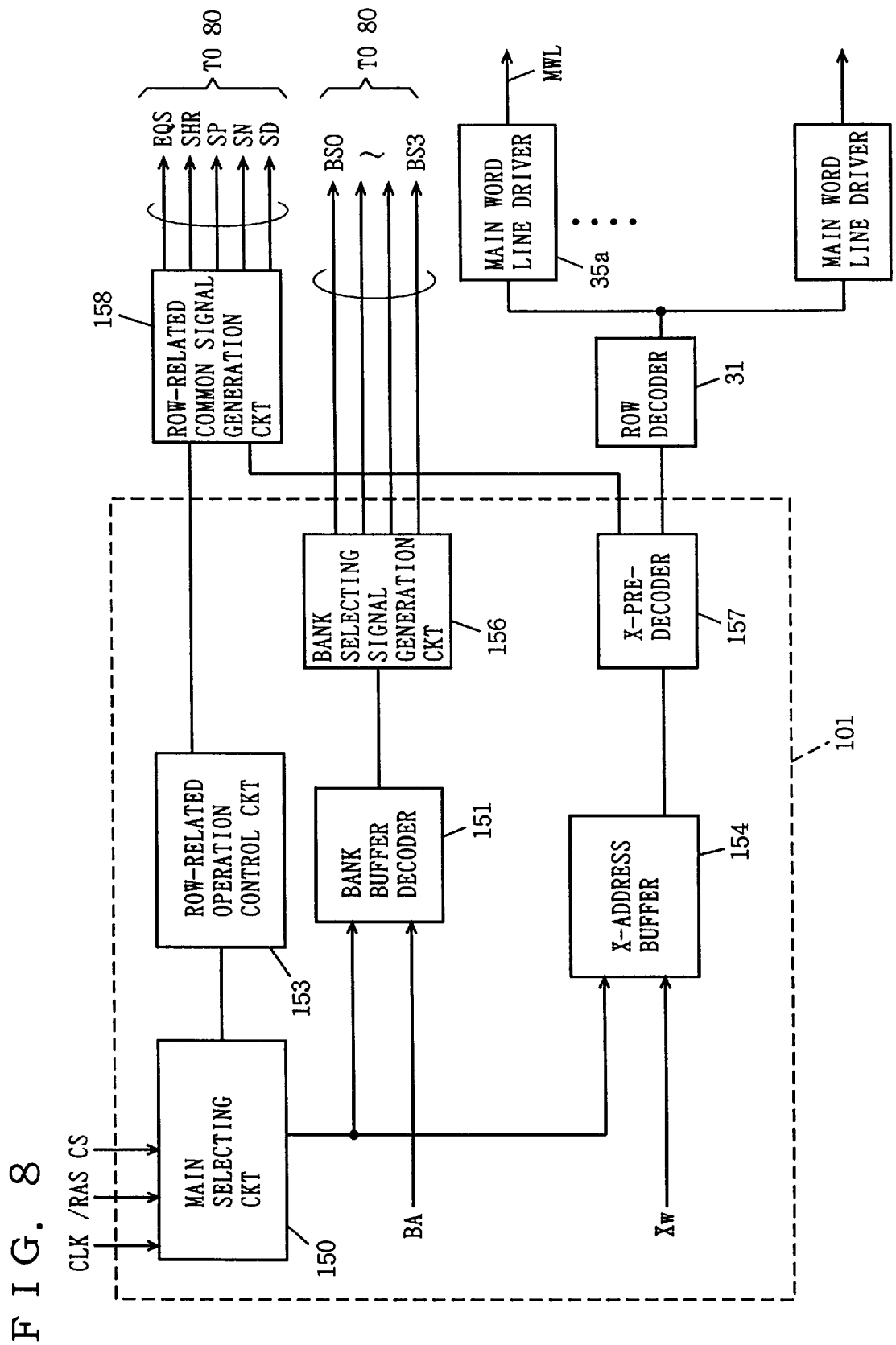
FIG. 8 is a schematic block diagram of the configuration of a row selecting operation portion 101 in a selecting control circuit 100.

FIG. 8 is a schematic diagram of the configuration of a portion related to a row selection hereinafter referred to as a row selecting portion) 101 in selecting control circuit 100.

Referring to FIG. 8, the row selecting portion includes a main selecting circuit 150 which receives a clock signal CLK, a chip select signal CS and a row address strobe signal /RAS which are applied externally, and detects the designation of an accessing to a memory, a bank buffer decoder 151 and a bank selecting signal generation circuit 156 which take in and decode an externally applied bank address signal BA and output bank selecting signals BS0 to BS3, an X-address buffer 154 activated at the time of the activation of the output signal of main selecting circuit 150 to take in an externally applied address signal Xw for addressing a word line to output an internal X-address signal, and an X-pre-decoder 157 which receives the internal X-address signal from X-address buffer 154 to perform a pre-decoding operation. A row pre-decode signal which has been pre-decoded by X-pre-decoder 157 is transmitted to a row decoder 31, and a main word driver 35a which receives an instruction from row decoder 31 drives main word line MWL.

The row selecting portion further includes a row-related operation selecting circuit 153 and a row-related common signal control circuit 158.

Row-related operation selecting circuit 153 controls the activation timings of main row-related common signals (EQS, SHR, SP, SN and SD) in order to control the activation of a sense amplifier corresponding to a sub block for the sub blocks of the same group including a selected row, the operation of pre-charging/equalizing a bit line, the connection of a bit line and a sense amplifier, and the activation of a sense amplifier.

Row-related common signal control circuit 158 is provided for each group as described in conjunction with FIG. 4, receives a row pre-decode signal from an X-pre-decoder 157 and an output from row-related operation selecting circuit 153, and activates main row-related common signals (SD, EQS, SP, SN and SHR) for a plurality of sub blocks belonging to the same group including a selected row address.

The outputs of bank selecting signal generation circuit 156 and row-related common signal control circuit 158 are transmitted to sub block driving circuit 80 provided for each of the sub blocks by bank selecting signal 91 and main row-related common signal line 92.

Figure 9:
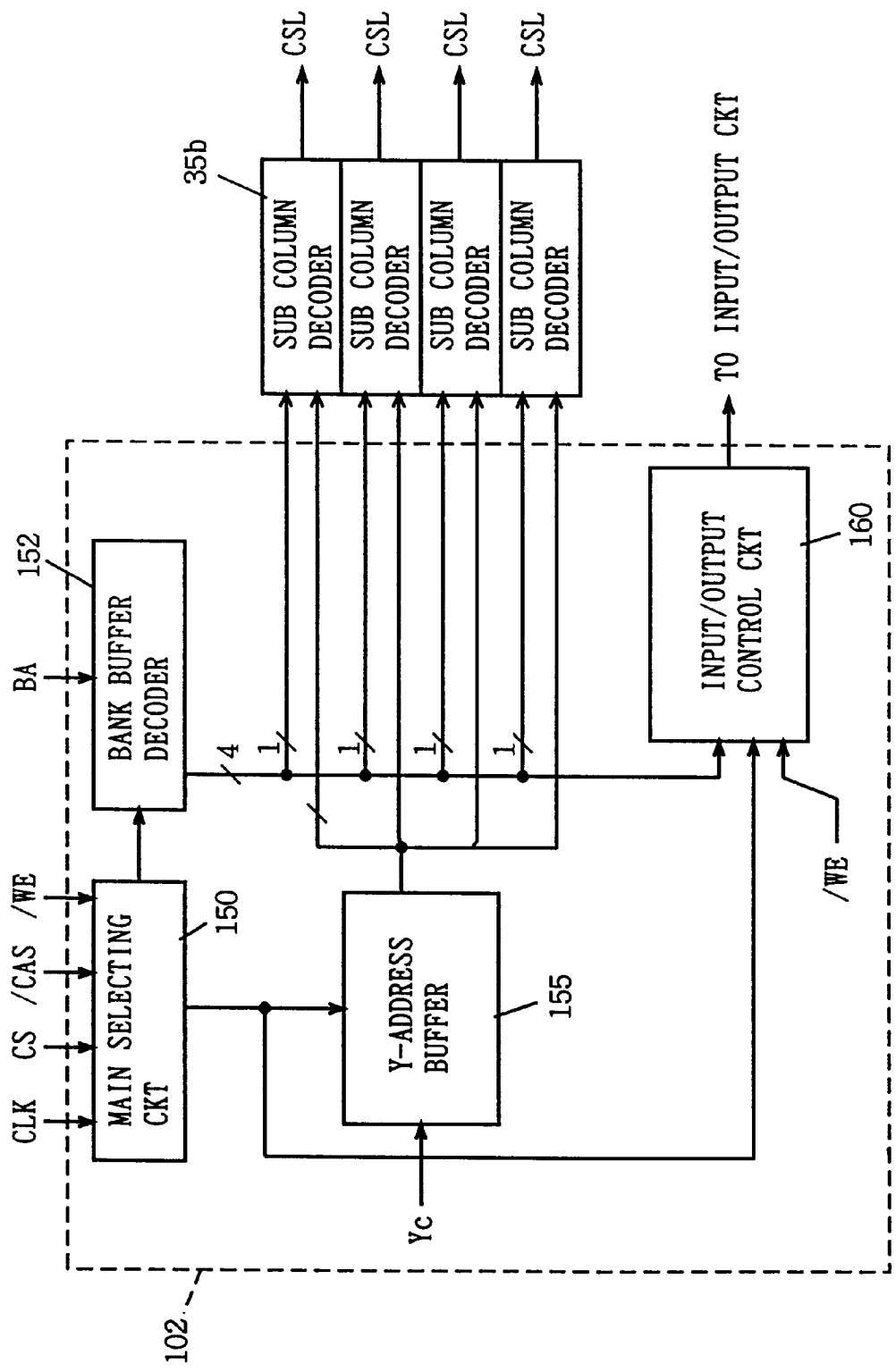
FIG. 9 is a schematic block diagram of the configuration of a column selecting operation portion 102 in selecting control circuit 100.

FIG. 9 is a diagram showing the configuration of a portion related to a column selection (hereinafter referred to as a column selecting control portion) 102 in selecting control circuit 100. In FIG. 9, the column selecting control portion includes a main selecting circuit 150 which receives chip select signal CS, dock signal CLK and column address strobe signal /CAS, a bank buffer decoder 152 which takes in and decodes an externally applied bank address BA in response to the output signal of main selecting circuit 150, a Y-address buffer 154 which takes in an externally applied address signal YC in response to the output signal of control circuit 150 to output an internal Y address signal, and an input/output control circuit 160 which controls a data inputting operation (the data transfer between a data input/output terminal and an internal circuit) in response to the output signal of bank buffer decoder 152 and the output signal of main selecting circuit 150.

The output signals of bank buffer decoder 152 and Y-address buffer 154 are applied to sub column decoder 35b shown in FIG. 4. Main selecting circuit 150 detects the designation of a column selecting operation in response to the above external signals, and brings bank buffer decoder 152 and Y-address buffer 155 into an activated state if such a designation is present.

Bank buffer decoder 152, when activated, decodes bank address signal BA to output a signal to address a corresponding bank, and activates one of sub column decoders 35b. A sub column decoder 35b provided corresponding to each of the banks is activated based on the output signal of bank buffer decoder 152, decodes the internal Y-address signal from Y-address buffer 155, and brings, into a selected state, one of corresponding column selecting lines CSL.

Input/output control circuit 160 determines whether data is input or output based on the combination of the output signal of main selecting circuit 150 and write enable signal /WE, determines to/from which bank data is input/output based on a bank designation signal designated by bank buffer decoder 152, and makes such a control that data transfer is performed between a selected bank and the data input/output terminal.

Using the configuration of selecting control circuit 100 shown in FIGS. 8 and 9, data may be surely input/output to/from a selected bank if there are a plurality of banks in a single memory cell array.

Detailed Structure of Sub block selecting Flag Generation Circuit

Figure 10:
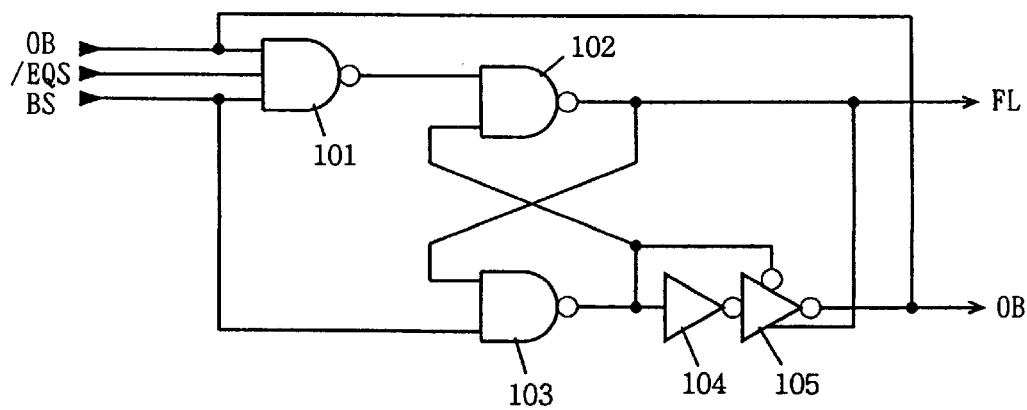
FIG. 10 is a diagram showing the specific circuit configuration of a sub block selecting flag generation circuit 82.

FIG. 10 is a circuit diagram showing in detail the configuration of sub block selecting flag generation circuit 82 according to the first embodiment.

Sub block selecting flag generation circuit 82 generates sub block selecting flag FL in order to activate a sub block including a selected memory cell.

Referring to FIG. 10, sub block selecting flag generation circuit 82 includes a logic gate 101 which receives a signal /EQS produced by inverting a bit line equalize signal EQS which is one of the main row-related signals, a bank selecting signal BS and a bank state signal OB, and logic gates 102 and 103 forming an RS flip-flop using sub block selecting flag FL and the inverted signal thereof as two outputs.

Sub block selecting flag generation circuit 82 further includes an inverter 104 which receives the output of logic gate 103, and a clocked inverter 105 which attains an open state when the output of logic gate 103 is switched in response to the output of inverter 104.

Bank state signal OB is commonly applied to all the sub blocks within the same bank by a bank state signal line. Bank state signal OB is generated as the inverse of block selecting flag FL by the output of clocked inverter 105 when sub block selecting flag FL is activated (into an "H" level). More specifically, the bank state signal line is activated (into an "L" level) when the other sub blocks in the same bank are activated.

In an initial state, a bank and a sub block are not selected, the bit line equalize signal is in an inactive state (at an "H" level), the inputs of logic gate 101, /EQS, BS, and FL are all at an "L" level. Meanwhile, bank state signal OB is at an "H" level (in an inactive state).

Herein, when a selected cell is determined by an address signal and a bank address and a row address start to be decoded, the bank selecting signal BS of a bank of interest is activated by bank selecting signal generation circuit 156 shown in FIG. 8.

Then, row-related common signal control circuit 158 instructs an activation (into an "H" level) of bit line equalize signal EQS to a sub block including the selected memory cell. Thus, the inputs of logic gate 101 all attain an "H" level, and the output of logic gate 101 is changed to an "L" level. Thus, sub block selecting flag FL, the output of logic gate 102 forming the RS flip-flop is changed into an active state (an "H" level), and the designation of the activation of the sub block is recognized.

Accordingly, clocked inverter 105 attains an open state and performs a normal inverting operation, so that bank state signal OB is changed into an active state (an "L" level).

Sub block selecting flag FL is the output of the RS flip-flop, the flag maintains its active state ("H" level) until bank selecting signal BS, an input of logic gate 103 forming the RS flip-flop attains an inactive state ("L level").

More specifically, bank state signal OB is changed into an active state ("L" level) as sub block selecting flag FL is activated. Bit line equalize signal EQS again attains an inactive state ("H" level) in order to activate a sub block included in the other banks, and signal /EQS is changed into an "L" level.

Sub block selecting flag FL which has once attained an active state however maintains the active state ("H" level) until bank selecting signal BS is inactivated, regardless of the inactivation of these signals.

Bank state signal OB is applied as an active state ("L" level) signal commonly to the other sub blocks included in the same bank when one sub block in the bank is activated by the bank state signal. Thus, in sub block selecting flag generation circuit 82 provided in the other sub blocks, sub block selecting flag FL will not be activated.

As a result, unlike "Conventional Art 2, if a plurality of bank selecting signals BS are serially activated, a plurality of sub blocks in the same bank will not be activated, so that the connection of a plurality of memory cells row-selected to the same bit line can be surely avoided.

Figure 11:
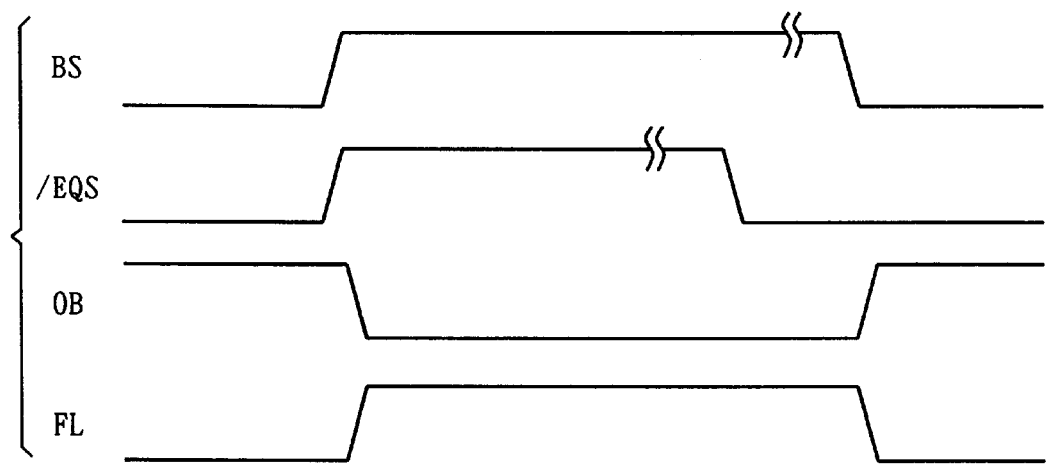
FIG. 11 is a waveform chart showing the state of each signal in FIG. 10.

FIG. 11 is a waveform chart showing the state of each signal in FIG. 10.

Referring to FIG. 11, in the initial state, bank selecting signal BS and equalize inverted signal /EQS are at an "L" level as described above, while bank state signal OB is at an "H" level.

In this case, a sub block is not activated, and sub block selecting flag FL is in an inactive state ("L" level). If a selected memory cell is included in the sub block, bank selecting signal BS is activated (into an "H" level), and bit line equalize signal EQS is activated, which changes signal /EQS into an "H" level. Thus, the three inputs of logic gate 101 all attain an "H" level, sub blocks selecting flag FL attains an "H" level, and the bank state signal line is activated (into an "L" level).

Sub block selecting flag FL which has been once activated maintains its active state ("H" level) if bank state signal OB and signal /EQS both attain an "L" level and is inactivated only when the selection of the bank is canceled and bank selecting signal BS is inactivated (into an "L" level). More specifically, the activated state of the sub block is canceled.

Bank State Signal Line

Figure 12:
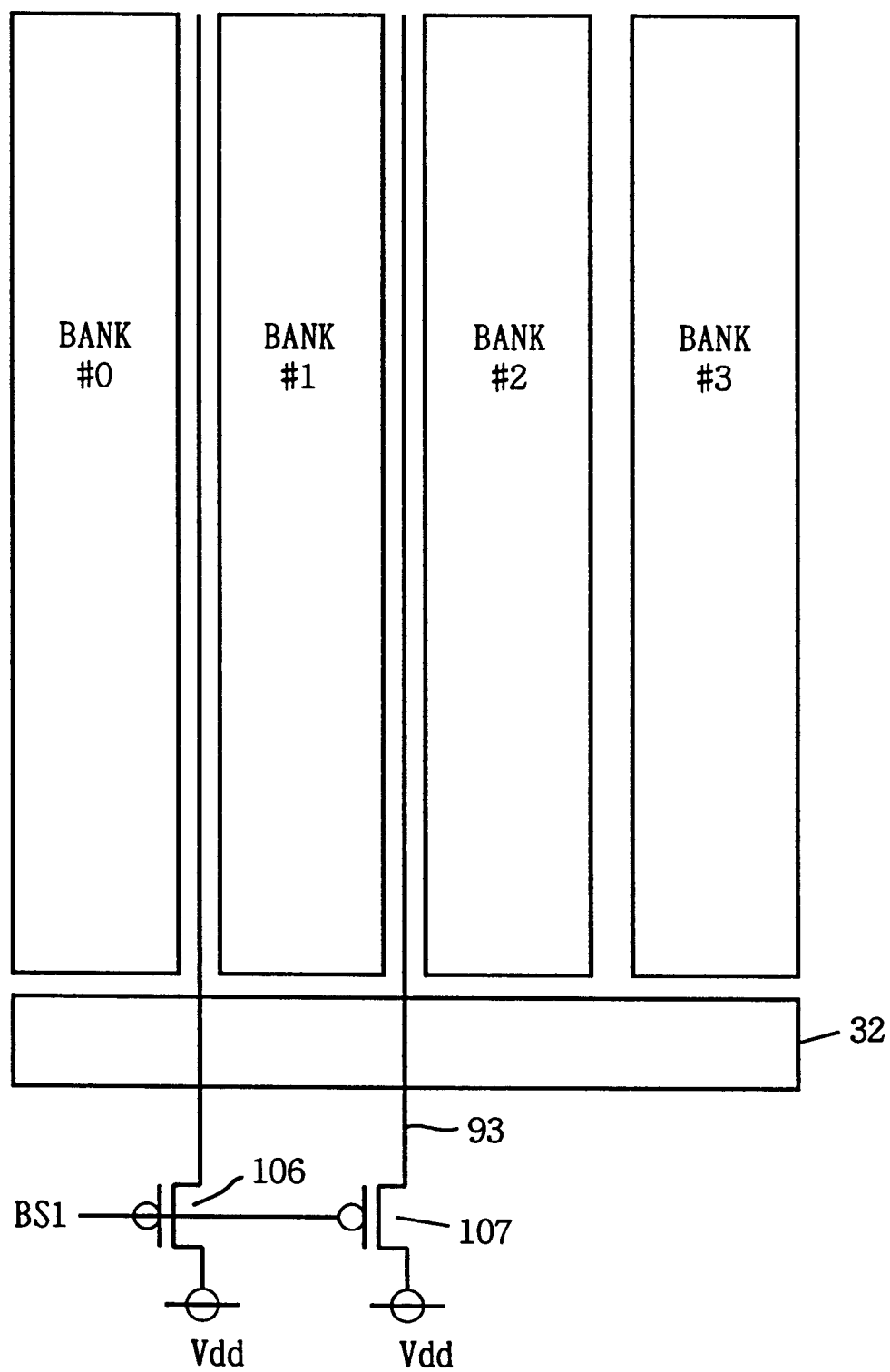
FIG. 12 is a diagram showing the arrangement of signal lines for a bank state signal OB.

A pre-charge circuit for the bank state signal line will be now described. FIG. 12 is a diagram showing the configuration of bank state signal line 93 corresponding to bank #1 by way of illustration.

Referring to FIG. 12, bank state signal line 93 is provided in the column-direction through a region adjacent to the sub block in the row-direction. In other words, bank state signal line 93 is provided in the same direction as that of bank selecting signal line 91 shown in FIG. 4. Bank state signal line 93 is applied commonly to sub block selecting flag generation circuit 82 corresponding to a sub block included in the same bank as is the case with bank selecting signal line 91.

Bank state signal line 93 is connected to an external power supply having a power supply potential Vdd corresponding to the "H" level through transistors 106 and 107 which receive at their gates a bank selecting signal. Thus, bank state signal line 93 attains an "H" level when bank selecting signal BS is in an inactive "L" level state, while signal line 93 is disconnected from the power supply potential to have a state corresponding to the operation of the circuit shown in FIG. 10 when bank selecting signal BS is activated in response to a selection of a bank. Thus, the state of bank state signal OB may be more stably controlled.

Specific Example of Local Signal Generation Circuit

A specific example of local signal generation circuit 84 which generates a local signal to permit operations in an activated sub block to be performed independently from the other sub blocks will be now described.

Figure 13:
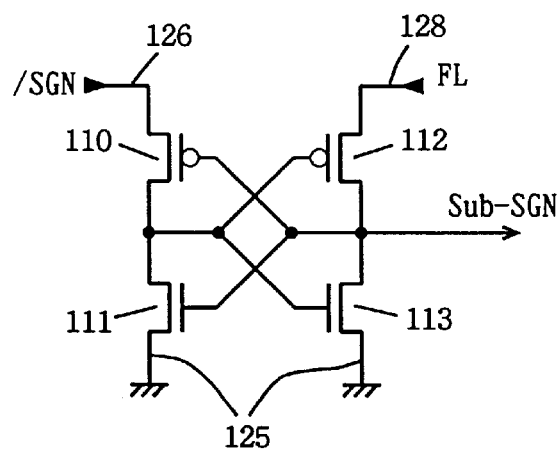
FIG. 13 is a diagram of the circuit configuration of a local signal generation circuit 84.

FIG. 13 is a circuit diagram of the configuration of local signal generation circuit 84. Referring to FIG. 13, local signal generation circuit 84 includes a pair of P-type transistor 110 and an N-type transistor 111 which receive at their sources a /SGN signal line 126 transmitting a signal /SGN, the inverse of a main row-related roundup signal SGN to form an inverter with a ground interconnection 125, and a pair of a P-type transistor 112 and an N-type transistor 113 which receive at their sources sub block selecting flag (FL) signal line 128 to form an inverter with ground interconnection 125. The outputs of the inverters formed by the transistor pairs are each the input of the inverter formed by the other transistor pair, in other words, a so-called "cross latch" is formed.

The output of the inverter formed by P-type transistor 112 and N-type transistor 113 is used as a local roundup signal Sub-SGN within a sub block.

Herein, main row-related collective signal SGN has this notation to take care of main row-related common signals collectively in the same signal state, and more specifically includes an activation signal SN for an N-type sense amplifier, shared sense amplifier signal SHR, sub decode signal SD, bit line equalize signal EQS, signal /EQS, the inverse of signal EQS, and signal ISP, the inverse of an activation signal for a P-type sense amplifier. In the active state of each of the above signals, signals SGN all attain an "H" level.

A signal Sub-SGN also has this notation to collectively take care of local signals within a sub block, and includes signals Sub-SN, /Sub-SP, Sub-SHR, Sub-SD, and /Sub-EQS corresponding to the above signals. In the active state of each of the signals, signals Sub-SGN all attain an "H" level.

Signal Sub-SGN is activated (into an "H" level) when signal /SGN is at an "L" level and sub block selecting flag FL is activated. Once signal Sub-SGN is activated, the conduction of transistors 111 and 112 is maintained, and signal Sub-SGN maintains its "H" level until sub block selecting flag FL is inactivated regardless of the state of signal /SGN.

Thus, based on a main row-related common signal applied commonly to each sub block, local signals are generated only within an activated sub block, and a row selecting operation is controlled within the activated sub block independently from the other sub blocks.

Local signal generation circuit 84 shown in FIG. 13 is provided for each of the sub blocks corresponding to the respective main row-related common signals.

Figure 14:
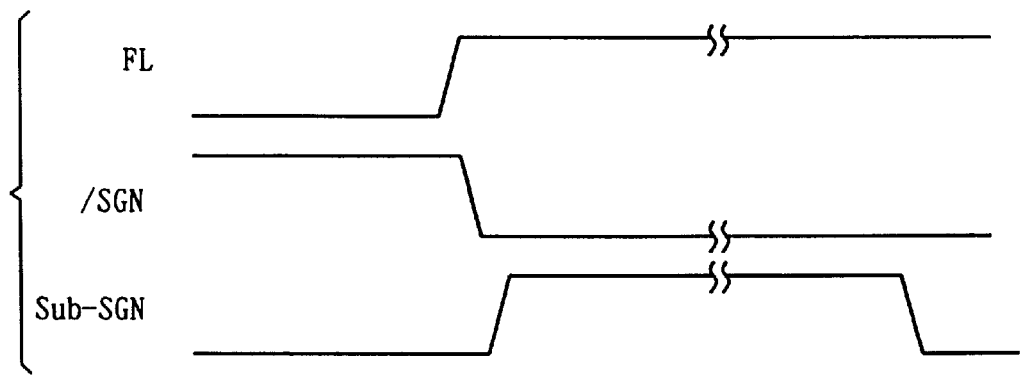
FIG. 14 is a waveform chart showing the state of each signal in FIG. 13.

FIG. 14 is a waveform chart for use in illustration of the state of each signal in the circuit shown in FIG. 13. Referring to FIG. 14, in the state before a sub block is activated, sub block selecting flag FL is at an "L" level, and the main row-related common signal corresponding to the sub block is in an inactive state, so that signal /SGN is at an "H" level. In this case, the conduction of P-type transistor 110 and N-type transistor 113 are maintained, and signal Sub-SGN is at an "L" level.

Herein, if a memory cell included in this sub block is selected, sub block selecting flag FL attains an "H" level, the main row-related common signal is activated, and signal /SGN attains an "L" level accordingly.

As a result, signal Sub-SGN is activated, and signal Sub-SGN once activated maintains its "H" level until sub block selecting flag FL attains an "L" level, regardless of the state of signal /SGN.

Thus, according to sub block selecting flag FL attaining an "H" level in the activated sub block, local signals are independently generated within each sub block, and a series of row selecting operations may be performed independently among the sub blocks.

Specific Example of Sub Word Driver

A specific example of the configuration of a sub word driver to drive, into a selected state, a sub word line provided for each row in a sub block independently among the sub blocks will be now described.

Figure 15:
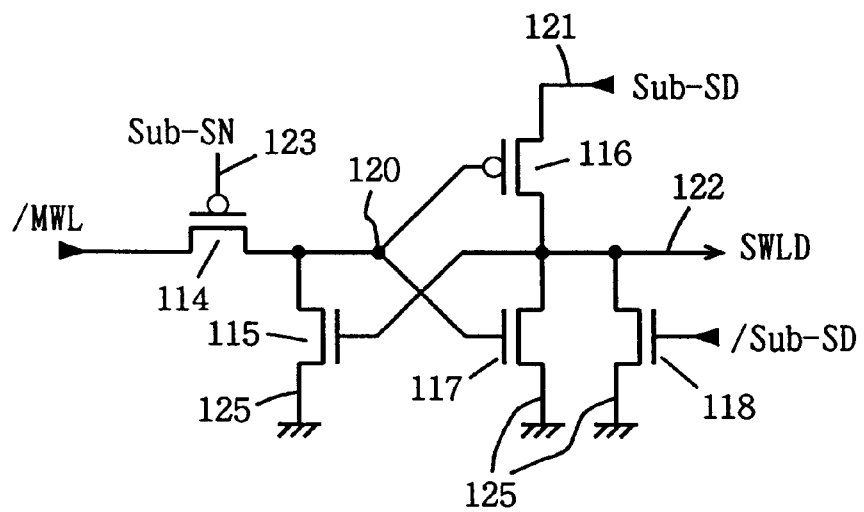
FIG. 15 is a diagram of the specific configuration of a sub word driver 60.

FIG. 15 is a diagram showing the specific configuration of a sub word driver 60. Referring to FIG. 15, sub word driver 60 receives local signals Sub-SN and Sub-SD generated by local signal generation circuit 84, and the inverse /MWL of main word line MWL to generate a signal SWLD indicating the selected state of a sub word line SWL.

More specifically, sub word driver 60 includes an intermediate node 120 connected with /MWL through a P-type transistor 114 which receives a Sub-SN signal line 123 at its gate, a SWLD signal line 122 to be an output, a P-type transistor 116 having a gate connected with intermediate node 120 to connect a Sub-SD signal line 121 and SWLD signal line 122, an N-type transistor 117 having a gate connected with intermediate node 120 to connect a ground potential and SWLD signal line 122, an N-type transistor 115 having a gate to receive SWLD signal line 122 to connect intermediate node 120 and ground interconnection 125, and an N-type transistor 118 having a gate to receive /Sub-SD to connect the ground potential and SWLD signal line 122.

In the initial state in which sub word line SWL is not driven, signals Sub-SN and Sub-SD are at an "L level, and /MWL is at an "H" level. At this time, the conduction of N-type transistors 114 and 117 pulls signal line SWLD into an "L" level. While Sub-SD signal line 121 is in an active state ("L" level) by the function of an N-type transistor 118, and signal line SWLD maintains its inactive state ("L" level).

Herein, a selected memory cell is addressed, through bank selecting signal line 91 and main row-related common signal line 92 shown in FIG. 4, sub block selecting flag generation circuit 82 and local signal generation circuit 84 activate (into an "H" level) Sub-SD signal line 121 and Sub-SN signal line 123. Main word driver 35 activates (into an "H" level) main word line MWL as well. Note that the signal lines are activated in the order of Sub-SD signal line 121, MWL, and Sub-SN signal line 123 in terms of the timing.

As Sub-SD signal line 121 is activated, N-type transistor 118 is brought into a non-conductive state. Then, as main word line MWL is activated, intermediate node 120 is brought into an "L" level, so that P-type transistor 116 conducts in place of N-type transistor 117, SWLD signal line 122 is connected with Sub-SD signal line 121, and an active state ("H" level) is attained.

If Sub-SN signal line 123 is activated, a P-type transistor 114 attains a non-conductive state, and the state of main word line MWL is not accepted until the activation of the sub block is canceled.

However, once SWLD signal line 122 is activated, an N-type transistor 115 conducts as a result, and SWLD signal line 122 maintains its active state ("H" level) until signal line Sub-SD is inactivated (into an "L" level). More specifically, the active state of main word line MWL does not have to be maintained in order to maintain the state of once activated SWLD signal line.

By employing the above-described configuration for sub word driver 60, a sub decode signal line is not necessary for each of main word lines, so that a row selecting operation to a memory cell included in each bank may be independently performed with a reduced number of signal lines.

Figure 16:
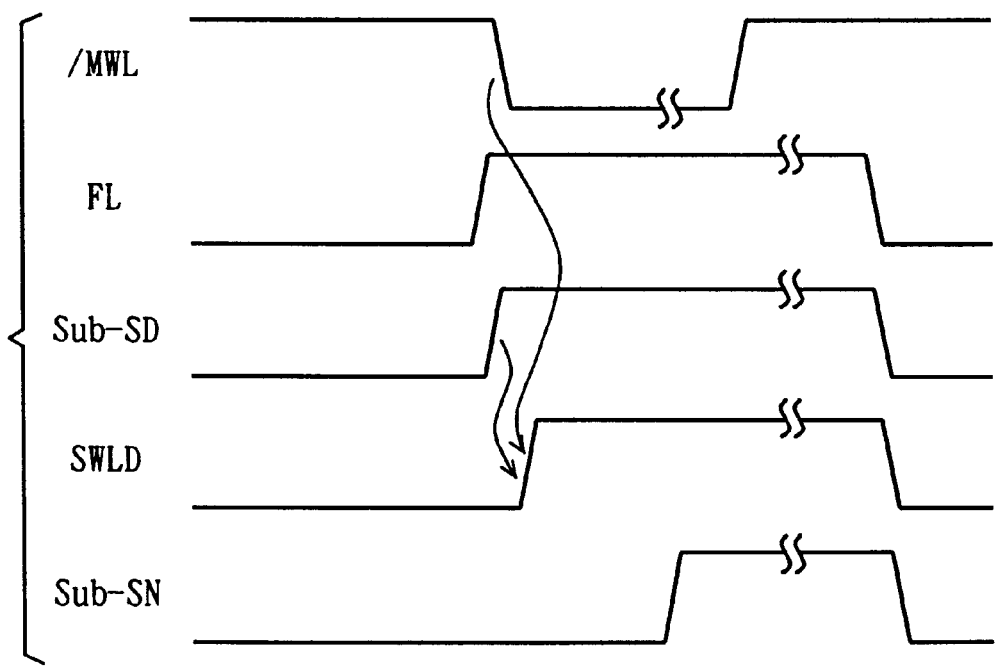
FIG. 16 is a waveform chart showing the state of each signal in FIG. 15.

FIG. 16 is a waveform chart for use in illustration of the state of each signal in FIG. 15.

As described above, as sub block selecting flag FL is activated, signal lines Sub-SD and Sub-SN are activated (into an "H" level) in this order. Meanwhile, as main word line MWL is activated, /MWL is pulled to an "L" level.

Thus, signal line SWLD is activated, and after signal line Sub-SN is changed to an active state ("H" level), the active state of signal line SWLD is maintained independently from the selected state of MWL until the inactivation of Sub-SD, in other words until the selected state of the sub block is canceled.

Overall Operations

The operation sequence of the entire semiconductor memory device according to the operation described above will be now described.

Although not specifically limited, let us now assume that a semiconductor memory device 1 is a synchronous type semiconductor memory device which operates in synchronism with an external clock signal CLK in the following description.

Figure 17:
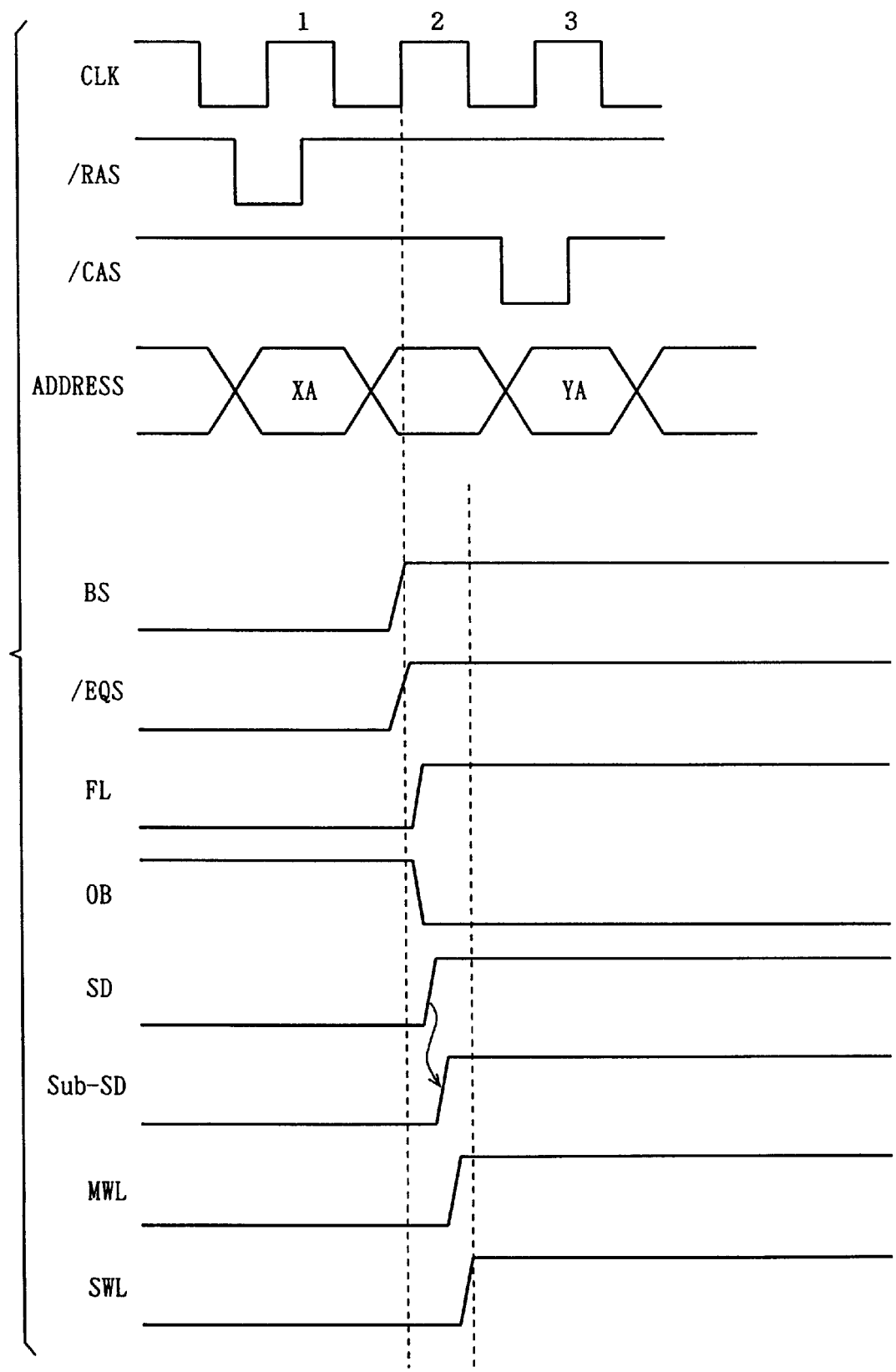
FIG. 17 is a waveform chart showing the operation from addressing to selection of a sub word line in semiconductor memory device 1 according to the first embodiment of the invention.

FIG. 17 is a timing chart showing the operations since a memory cell is addressed until a sub word line corresponding to the addressed memory cell is driven into an active state.

In the clock cycle 1 of external clock signal CLK, at a rising of clock signal CLK, row address strobe signal /RAS attains an "L" level active state, a bank corresponding to an address signal XA applied at this time is addressed, and bank signal selecting signal BS is activated (into an "H" level).

According to address signal XA, bit line equalize signal EQS, one of main row-related signals commonly applied to a sub block including the selected row is activated.

When the inverse /EQS of the equalize signal is changed into an "H" level, a sub block including the addressed memory cell is activated, and sub block selecting flag FL is activated. Another bank identification signal OB is activated (into an "L" level), and a plurality of sub blocks are activated in the same bank.

Then, sub decode signal SD corresponding to address signal XA is activated, and local sub decode signal Sub-SD is activated by sub block local signal generation circuit 84 within the sub block having sub block selecting flag FL activated.

Furthermore, row decoder 31 and main word line driver 35a shown in FIG. 2 generate a word line selecting signal, and main word line MWL corresponding to the selected row is driven into a selected state. In response to the activation of signal Sub-SD and main word line MWL, sub word driver 60 drives sub word line SWL into a selected state.

Through these series of operations, sub word line SWL corresponding to the selected row is driven only in the sub block including the memory cell having the selected address.

Figure 18:
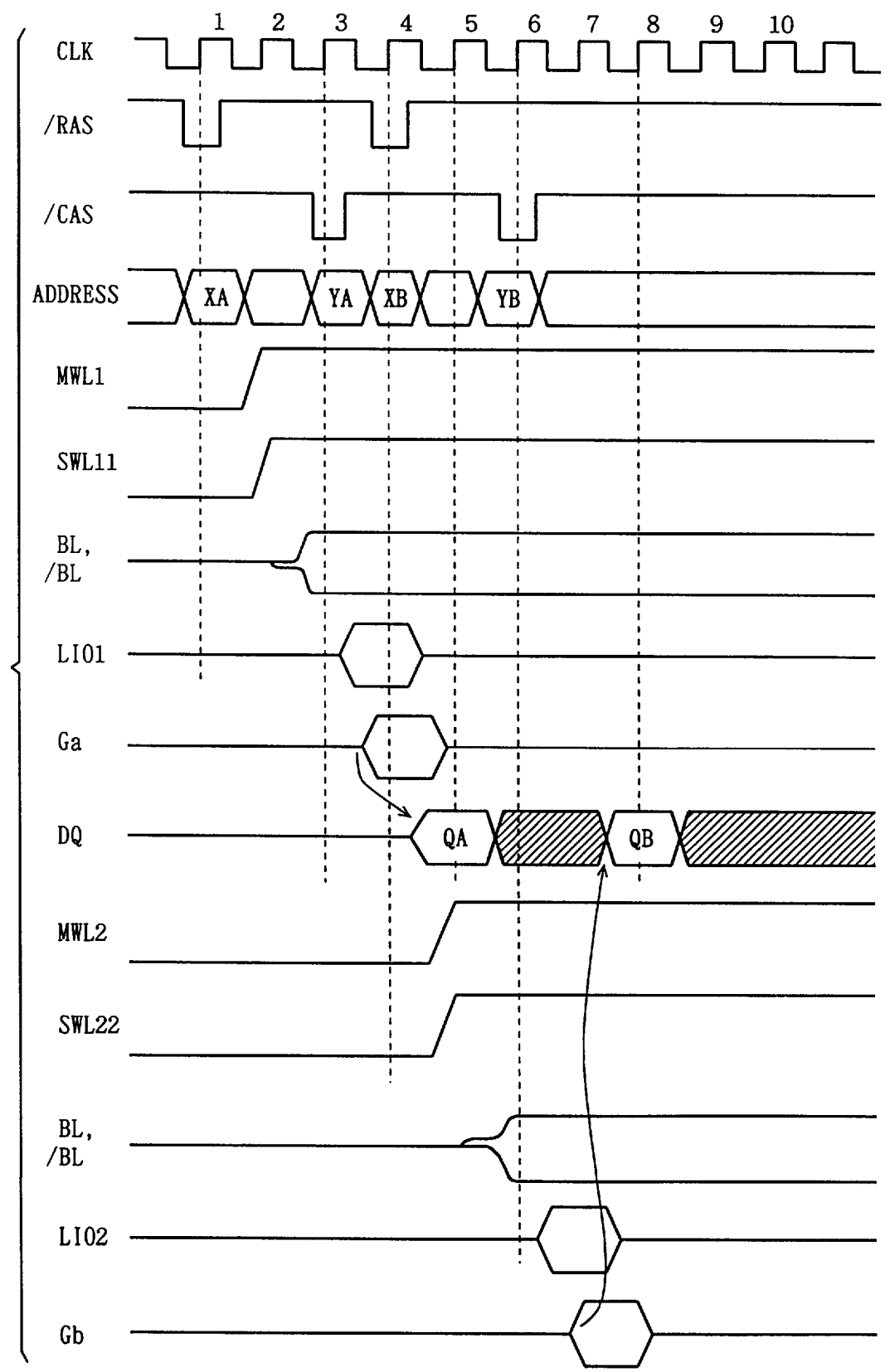
FIG. 18 is a signal waveform chart showing the operation of reading data in semiconductor memory device 1 according to the first embodiment of the invention.
Figure 19:
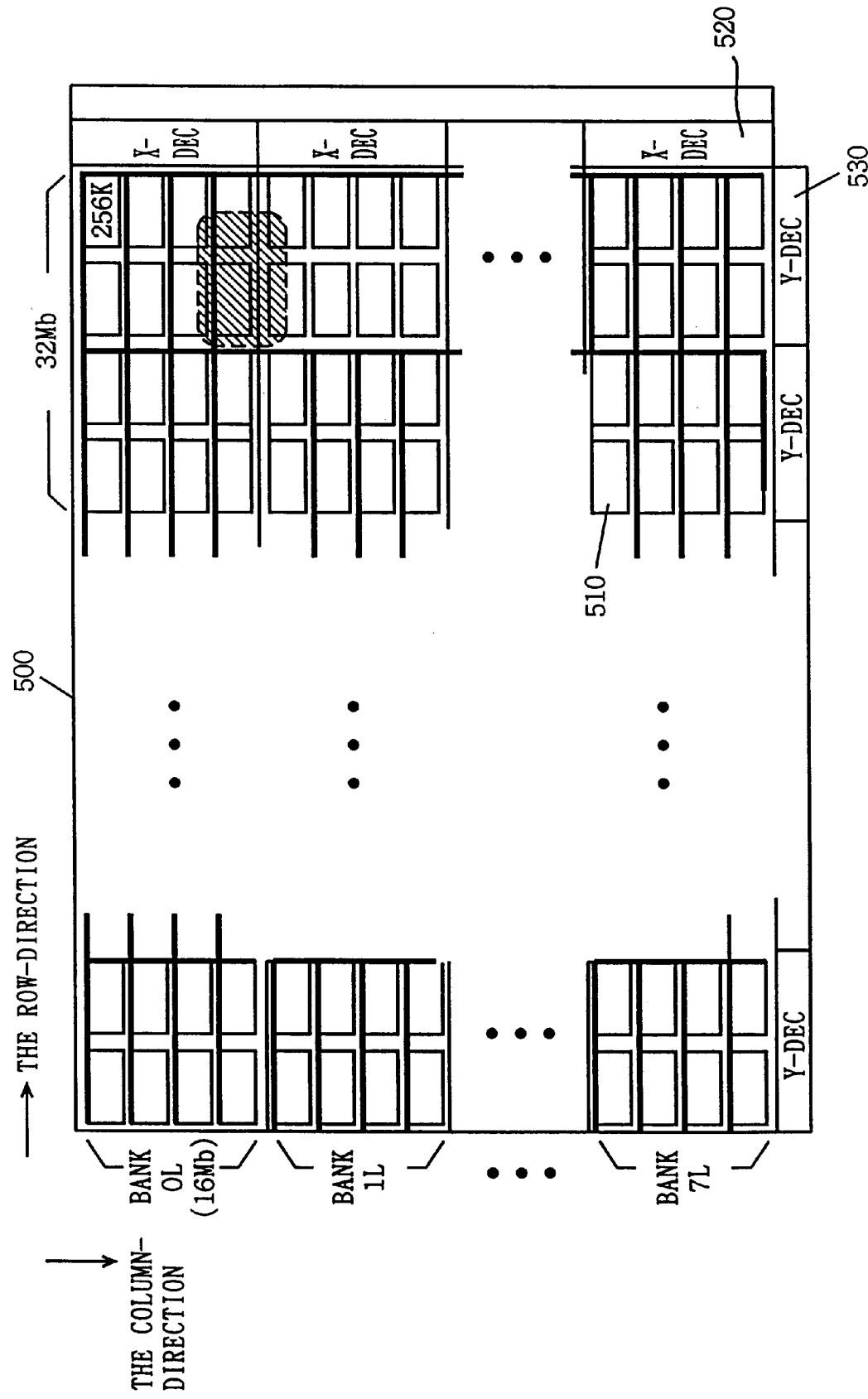
FIG. 19 is a diagram of the configuration of a memory cell array in a multi-bank DRAM 2000 according to Conventional Art 1.
Figure 20:
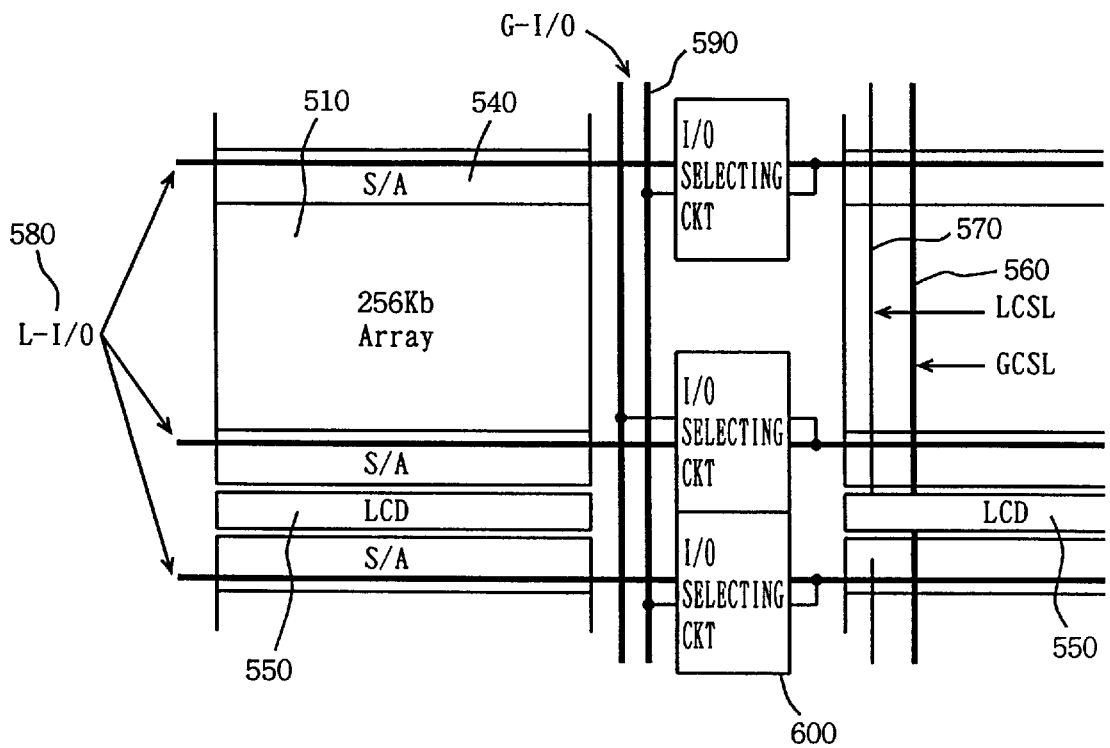
FIG. 20 is a diagram of the configuration of the periphery of a sub array in multi-bank DRAM 2000 according to Conventional Art 1.
Figure 21:
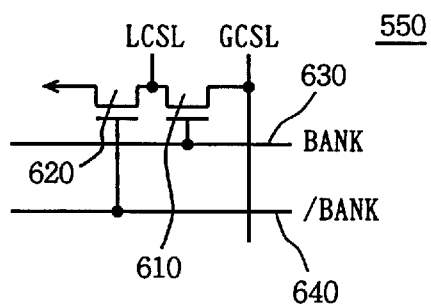
FIG. 21 is a diagram of the configuration of a local column decoder in multi-bank DRAM 2000 according to Conventional Art 1.

FIG. 18 is a timing chart for use in illustration of the operation sequence when a data reading operation is performed over a plurality of banks. In FIG. 18, since the operations since main word line MWL is selected until sub word line SWL is driven into a selected state have been already described and will not be described in conjunction with FIG. 18.

In FIG. 18, data QA in a memory cell addressed by addresses XA and YA in bank #1 is read out, and then data QB in a memory cell addressed by addresses XB and YB in bank #2 is read out by way of illustration.

In clock cycle 1, address signals XA and YA are applied, and a word line MWL1 and then a sub word line SWL11 are selected and driven accordingly. Thus, storage data in a memory cell MC connected to sub word line SWL11 is transmitted onto a corresponding bit line pair. In FIG. 18, the state in which "L" level data is read out onto a bit line pair BL /BL is shown by way of illustration.

At this time, a memory cell including sub word line SWL11 is connected to a sense amplifier SA through a bit line isolation gate. In clock cycle 3, at a rising of clock signal CLK, column address strobe signal /CAS attains an "L" level active state, and an address applied at this time is taken as a column address signal YA, and a corresponding column in bank #1 is selected.

In column decoder 32, sub column decoder 35b provided for bank #1 is activated for a column selecting operation, and a column selecting signal to a corresponding column is activated. According to the column selecting signal on column selecting line CSL, data on bit line pair BL and /BL detected and amplified by sense amplifier SA is transmitted onto local I/O line LIO1 through transmission gates T1 and T2, and the data on local I/O line LIO1 is changed into a potential corresponding to memory cell data. Then, transmission gates T3 and T4 for block selecting signal BSG conduct, and data on local I/O line LIO#1 is transmitted onto a global IOG bus Ga. Subsequently, the data is transferred in synchronism with clock signal CLK, and defined data QA is read out in clock cycle 7.

Meanwhile, in parallel with the reading operation of data QA in clock cycle 4, signal /RAS once again attains an active state low level, a row in bank #2 is selected by address signal XB at this time, and a selecting operation to the addressed row is performed. In bank #2, a memory cell portion including a selected row in a sub block including the addressed memory cell is connected to a sense amplifier. Herein if main word line MLW2 is addressed by address signal XB, a word line selecting signal from main word line driver 35 is transmitted onto main word line MWL2, and the potential on main word line MWL2 is raised to an "H level.

Meanwhile, since bank #2 is selected according to address signal XB, bank selecting signal BS2 is similarly in an "H" level active state, and the potential of sub word line SWL2 similarly rises to an "H" level. Thus, data in a memory cell MC connected to this selected sub word line SWL2 is transmitted onto a corresponding bit line pair BL and /BL.

In FIG. 18, the state in which "H" level data is read out onto bit line pair BL and /BL is shown by way of illustration. Subsequently, a sense amplifier SA is activated in a corresponding sense I/O circuit SIO, and the read out memory cell data is detected and amplified.

In parallel with these series of sensing operations, column address strobe signal /CAS falls to an "L" level in clock cycle 5, address signal YB at this time is taken as a column address signal and a bank address signal, a sub column decoder 34 provided corresponding to bank #2 is activated, and address signal YB is decoded by sub decoder 34. Based on the result of decoding, a column selecting line included in bank #2 is brought into a selected state, transmission gates T1 and T2 included in sense I/O circuit SIO conduct, and data on bit line BL (/BL) is read out onto local I/O line LIO#2.

Thereafter transmission gates T3 and T4 for block selecting gate BGS provided for bank #2 are turned on, and the data on local I/O line LIO#2 is transmitted onto global I/O line Gb. The data read out onto global I/O line Gb is transferred according to a clock signal and output as reading data QB in clock cycle 10.

As described above, by permitting each sub block to be driven independently from the other sub blocks, if a sub block belonging to a certain bank is in a selected state, a memory cell in a sub block belonging to another bank may be selected and accessed.

Note that in order to avoid the complication of illustration, a row address (XB) is newly designated in bank #2 in clock cycle 4 after a column address (YA) in bank #1 is designated, but it is understood that row address XB may be designated before designating column address YA, in other words, in clock cycle 2

Variation of First Embodiment

In a variation of the first embodiment, all the main row-related common signals transmitted commonly to sub blocks adjacent to each other in the row-direction by main row-related common signal line 92 are all one-shot signals. Since main row-related common signal line 92 supplies common signals to sub blocks belonging to different banks, using main row-related control signals as a one-shot trigger, local signals may be independently developed only in an activated sub block based on the trigger, so that each bank may be independently and stably driven.

In this case, a signal transmitted by main row-related common signal line 92 needs only be activated at an activation edge of clock signal CLK in one clock cycle of external clock signal CLK, and the one-shot pulse width thereof may be shorter than one clock cycle of clock signal CLK.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells arranged in a matrix of rows and columns,
   said memory cell array being divided into a plurality of sub blocks arranged in a matrix of a first plurality of columns and a second plurality of rows and each column of said sub blocks operating as a bank on which read/write operations are performed independently of other banks;
   a plurality of sense amplifier groups provided corresponding to said sub blocks respectively for amplifying data read out from said memory cells;
   a plurality of sub control circuits provided in distribution corresponding to said plurality of sense amplifier groups respectively each for controlling an operation of a corresponding one of said plurality of sense amplifier groups; and
   a main control circuit provided in common to said plurality of sub control circuits, for controlling said plurality of sub control circuits.

2. The semiconductor device as recited in claim 1, further comprising:
   a plurality of main amplify control signal lines provided for said rows of sub blocks respectively, each for transmitting a main amplify control signal to the sub control circuits corresponding to a corresponding row of sub blocks; and
   a plurality of bank select signal lines provided for said columns of sub blocks respectively, each for transmitting a bank select signal to said sub control circuits corresponding to a corresponding column of sub blocks, wherein each of said plurality of sub control circuits activates the corresponding sense amplifier group in response to the signal levels of said main amplify control signal line and said bank select signal line.

3. The semiconductor memory device as recited in claim 1, wherein
   said memory cell array further includes a plurality of main word lines provided in common to the sub blocks arranged in the row-direction and corresponding to the rows of said memory cells,
   each of said plurality of sub blocks includes a plurality of sub word lines arranged for the rows of said memory cells respectively, and
   said semiconductor memory device further comprises:
   a plurality of sub word line driver groups provided corresponding to said plurality of sub blocks respectively, each for selectively driving said sub word line in a corresponding sub block.

4. The semiconductor memory device as recited in claim 1, further comprising:
   a plurality of bank state signal lines provided corresponding to the banks respectively, each for transmitting a bank state signal indicating the selected state of said sub block in a corresponding bank;
   a plurality of bank select signal lines provided corresponding to the banks respectively, each for transmitting a bank select signal; and
   a plurality of flag generation circuits provided corresponding to said plurality of sub control circuits, each receiving a first main control signal applied in common to the flag generation circuits corresponding to a corresponding row of said sub blocks for generating a flag, each of said plurality of flag generation circuits being coupled to a corresponding bank state signal line and a corresponding bank select signal line for activating the flag and the bank state signal in response to the first main control signal and the bank select signal when the bank state signal is inactive, wherein
   each of said plurality of sub control circuits activates the corresponding sense amplifier group in response to a second main control signal applied in common to the sub control circuits corresponding to a corresponding row of said sub blocks when the flag generated by a corresponding flag generation circuit is active.

5. The semiconductor memory device as recited in claim 4, further comprising:
   a plurality of transistors provided corresponding to said plurality of bank state signal lines, each connected between a corresponding one of said plurality of bank state signal lines and a power supply having a potential corresponding to the inactivated state of the corresponding bank state signal line and receiving a corresponding bank state signal at its gate,
   each of said plurality of transistors being turned off when a corresponding bank select signal is activated.

6. The semiconductor memory device as recited in claim 2, wherein
   at least one of said bank select signal lines and at least one of said main amplify control signal lines are provided through a region between said sub blocks, and
   each of said plurality of sub control circuits is provided in a region at a crossing of a corresponding bank select signal line and a corresponding main amplify control signal line.

7. The semiconductor memory device as recited in claim 2, wherein each of said plurality of sub blocks includes a plurality of bit line pairs corresponding to the columns of said memory cells, each of said plurality of sense amplifier groups includes a plurality of sense amplifiers provided corresponding to said plurality of bit line pairs respectively, each for amplifying a potential difference generated at a corresponding bit line pair, said semiconductor memory device further comprises:

a plurality of precharge circuit groups provided corresponding to said plurality of sub blocks respectively, each including a plurality of precharge circuits for holding said bit line pairs at a prescribed reference voltage; and a plurality of main precharge signal lines provided for said rows of sub blocks respectively, each for transmitting a main precharge signal to the sub control circuits corresponding to a corresponding row of sub blocks, and each of said plurality of sub control circuits activates a corresponding precharge circuit group in response to the signal levels of the main precharge signal line and the bank select signal line.

8. The semiconductor memory device as recited in claim 7, further comprising:

a plurality of flag generation circuits provided corresponding to said plurality of sub control circuits, each for generating a flag;

a plurality of sub amplify control signal lines provided corresponding to said plurality of sub control circuits respectively, each for transmitting a sub amplify control signal from a corresponding sub control circuit to the sense amplifiers in a corresponding sense amplifier group; and a plurality of sub precharge signal lines provided corresponding to said plurality of sub control circuits respectively, each for transmitting a sub precharge signal from a corresponding sub control circuit to the precharge circuits in a corresponding precharge circuit group, wherein the sub amplify control signal is activated when a corresponding flag is activated and a corresponding main amplify control signal is activated, and activates said plurality of sense amplifiers in the corresponding sense amplifier group until the corresponding flag is inactivated, and the sub precharge signal is activated when the corresponding flag is activated and a corresponding main precharge signal is activated, and inactivates said plurality of precharge circuits in the corresponding precharge circuit group until the corresponding flag is inactivated.

9. The semiconductor memory device as recited in claim 2, wherein each of said plurality of main amplify control signal lines transmits the main amplify control signal in a one-shot pulse state.

10. The semiconductor memory device as recited in claim 2, wherein said semiconductor memory device performs a synchronizing operation by a clock signal, and each of said plurality of main amplify control signal lines transmits the main amplify control signal in a one-shot pulse state having a pulse width shorter than one cycle of said clock signal.

11. The semiconductor memory device as recited in claim 1, wherein said memory cell array further includes a plurality of main word lines provided in common to the sub blocks arranged in the row-direction and corresponding to the rows of said memory cells, each of said plurality of sub blocks includes a plurality of sub word lines provided for the rows of said memory cells respectively, and said semiconductor memory device further comprises:

a plurality of sub word line driver groups provided corresponding to said plurality of sub blocks respectively, each for selectively driving the sub word line in a corresponding sub block;

a plurality of main drive control signal lines for transmitting main drive control signals to said plurality of sub control circuits; and a plurality of sub drive control signal lines provided corresponding to said plurality of sub control circuits respectively, each for transmitting a sub drive control signal from a corresponding sub control circuit to a corresponding sub word line driver group.

12. The semiconductor memory device as recited in claim 11, further comprising a plurality of flag generation circuits provided corresponding to said plurality of sub control circuits for generating a flag, wherein said sub drive control signal is activated when a corresponding flag is activated and a corresponding main drive control signal is activated, and holds an active state until the corresponding flag is inactivated, and said sub word line is driven into a selected state when a corresponding main word line is driven into a selected state and a corresponding sub drive control signal is activated, while in a selected state, the selected state of said sub word line is held until the corresponding sub drive control signal is inactivated regardless of the selected state of the corresponding main word line.

13. The semiconductor memory device as recited in claim 11, wherein each of said plurality of sub blocks includes a plurality of bit line pairs provided corresponding to the columns of said memory cells, each of said plurality of sense amplifier groups includes a plurality of sense amplifiers provided corresponding to said plurality of bit line pairs respectively, each for amplifying a potential difference generated at a corresponding bit line pair, said semiconductor memory device further comprises:

a plurality of precharge circuit groups provided corresponding to said plurality of sub blocks respectively, each including a plurality of precharge circuits for holding said bit line pairs at a prescribed reference voltage;

a plurality of main amplify control signal lines provided corresponding to said rows of sub blocks respectively each for transmitting a main amplify control signal to the sub control circuits corresponding to a corresponding row of sub blocks; and a plurality of main precharge signal lines provided corresponding to said rows of sub blocks respectively, each for transmitting a main precharge signal to the sub control circuits corresponding to a corresponding row of sub blocks.

14. The semiconductor memory device as recited in claim 13, further comprising a plurality of bank select signal lines provided corresponding to the banks, each for transmitting a bank select signal to the sub control circuits provided for a corresponding bank;

a plurality of flag generation circuits provided corresponding to said plurality of sub control circuits, each for generating a flag and activating the flag in response to a corresponding main precharge signal and a corresponding bank select signal;

a plurality of sub amplify control signal lines provided corresponding to said plurality of sub control circuits respectively each for transmitting a sub amplify control signal from a corresponding sub control circuit to the sense amplifiers in a corresponding sense amplifier group; and a plurality of sub precharge signal lines provided corresponding to said plurality of sub control circuits respectively, each for transmitting a sub precharge signal from a corresponding sub control circuit to the recharge circuits in a corresponding precharge circuit group, wherein the sub amplify control signal is activated when a corresponding flag is activated and a corresponding main amplify control signal is activated, and activates said plurality of sense amplifiers in the corresponding sense amplifier group until the corresponding flag is inactivated, and the sub precharge signal is activated when the corresponding flag is activated and a corresponding main precharge signal is activated, and inactivates said plurality of precharge circuits in the corresponding precharge circuit group until the corresponding flag is inactivated.

15. The semiconductor memory device as recited in claim 11, wherein;

each of said plurality of main drive control signal lines transmits the main drive control signal in the form of one-shot pulse.

16. The semiconductor memory device as recited in claim 11, wherein said semiconductor memory device performs a synchronizing operation by a clock signal, and each of said plurality of main drive control signal lines transmits the main drive control signal in the form of one-shot pulse having a pulse width shorter than one cycle of said clock signal.

17. The semiconductor memory device according to claim 1, wherein the sub control circuits corresponding to each of the banks exclusively select one of the sense amplifier groups corresponding to said each of the banks.

18. A semiconductor memory device comprising:

a plurality of banks arranged in a row-direction each including memory cells arranged in a plurality of rows and a plurality of columns, each of said plurality of banks further including sub word lines provided corresponding to said plurality of rows of memory cells, and said sub word lines being divided into a plurality of sub word line groups;

a plurality of main word lines provided in common to said plurality of banks and each corresponding to the sub word line group in each of said plurality of banks; and a plurality of sub word line drivers provided corresponding to said plurality of sub word line groups respectively, each for driving the sub word line in a corresponding sub word line group in response to a decode signal transmitted by a corresponding main word line, a first local signal according to a bank select signal and a second local signal for selecting said sub word line in the corresponding sub word line group.

19. The semiconductor memory device according to claim 18, wherein:

each of said plurality of sub word line drivers includes driver units provided corresponding to the sub word lines in a corresponding sub word line group respectively, each including (a) a drive transistor having a source receiving the second local signal and (b) a control gate for turning on the drive transistor in response to the decode signal and the first local signal.

20. The semiconductor memory device according to claim 18, wherein each of said plurality of banks is divided into a plurality of sub blocks, and said semiconductor memory device further comprises:

sub control circuits provided in distribution corresponding to said sub blocks respectively, each for applying the first and second local signals to the sub word line driver provided for a corresponding sub block;

a main control circuit provided in common to said plurality of banks, for generating a first common signal and a second common signal;

a plurality of first common lines provided in common to said plurality of banks, each corresponding to the sub control circuit provided for each of said plurality of banks for transmitting the first common signal from said main control circuit to corresponding sub control circuits; and a plurality of second common lines provided in common to said plurality of banks, each corresponding to the sub control circuit provided for each of said plurality of banks for transmitting the second common signal from said main control circuit to corresponding sub control circuits.

* * * * *